United States Patent
Murata et al.

(10) Patent No.: US 7,193,756 B2
(45) Date of Patent: *Mar. 20, 2007

(54) PIEZOELECTRIC ELEMENT, METHOD FOR FABRICATING THE SAME, INKJET HEAD, METHOD FOR FABRICATING THE SAME, AND INKJET RECORDING APPARATUS

(75) Inventors: Akiko Murata, Osaka (JP); Eiji Fujii, Osaka (JP); Hideo Torii, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 240 days.

This patent is subject to a terminal disclaimer.

(21) Appl. No.: 10/997,143

(22) Filed: Nov. 24, 2004

(65) Prior Publication Data

US 2005/0146772 A1    Jul. 7, 2005

(30) Foreign Application Priority Data

Nov. 26, 2003 (JP) .............................. 2003-396013
May 10, 2004 (JP) .............................. 2004-139796

(51) Int. Cl.
*G02B 5/32* (2006.01)
*B41J 2/045* (2006.01)

(52) U.S. Cl. .......................................... 359/21; 347/71
(58) Field of Classification Search ............ 347/68–72; 310/311, 323.1; 359/21
See application file for complete search history.

(56) References Cited

U.S. PATENT DOCUMENTS

2005/0127795 A1* 6/2005 Torii et al. .................. 310/360

FOREIGN PATENT DOCUMENTS

| JP | 06-116095 A | 4/1994 |
|---|---|---|
| JP | 10-209517 A | 8/1998 |
| JP | 3021930 | 1/2000 |
| JP | 2002234156 A * | 8/2002 |
| JP | 2004-079991 A | 3/2004 |

OTHER PUBLICATIONS

R. Ramesh and D.G. Schlom, Materials Science: Orienting Ferroelectric Films, Science Magazine, vol. 296 No. 5575, pp. 1975-1976, online article, paragraph 6 lines 1-3 and paragraph 7.*

* cited by examiner

*Primary Examiner*—Stephen Meier
*Assistant Examiner*—Lisa M. Solomon
(74) *Attorney, Agent, or Firm*—Harness, Dickey & Pierce, P.L.C.

(57) ABSTRACT

A piezoelectric element includes a first electrode film; a piezoelectric layered film including a first piezoelectric thin film formed on the first electrode film and a second piezoelectric thin film formed on the first piezoelectric thin film; and a second electrode film formed on the second piezoelectric thin film. Each of the first and second piezoelectric thin films is an aggregate of columnar grains grown unidirectionally along the thickness direction of the piezoelectric layered film. The Pb content of the first piezoelectric thin film is smaller than the Pb content of the second piezoelectric thin film. A columnar grain of the second piezoelectric thin film has a larger average cross-sectional diameter than an average cross-sectional diameter of a columnar grain of the first piezoelectric thin film. A ratio of the thickness of the piezoelectric layered film to the average cross-sectional diameter of the second piezoelectric thin film is not less than 20 and not more than 60.

16 Claims, 14 Drawing Sheets

PIEZOELECTRIC ELEMENT, METHOD FOR FABRICATING THE SAME, INKJET HEAD, METHOD FOR FABRICATING THE SAME, AND INKJET RECORDING APPARATUS

CROSS-REFERENCE TO RELATED APPLICATION

The disclosure of Japanese Patent Application No. 2003-396013 filed on Nov. 26, 2003 including specification, drawings and claims, and the disclosure of Japanese Patent Application No. 2004-139796 filed on May 10, 2004 including specification, drawings and claims are incorporated herein by reference in its entity.

BACKGROUND OF THE INVENTION

1. Technical Field to which the Invention Belongs

The present invention relates to a piezoelectric element, an inkjet head, a method for fabricating the piezoelectric element and the inkjet head, and an inkjet recording apparatus.

2. Prior Art

A piezoelectric material converts mechanical energy into electric energy or electric energy into mechanical energy. A typical example of the piezoelectric material is lead zirconate titanate ($Pb(Zr,Ti)O_3$) (hereinafter referred to as "PZT"), that is, an oxide with a perovskite type crystal structure. In using the PZT with a tetragonal perovskite crystal structure in particular, a maximum piezoelectric displacement can be obtained along the <001> axis direction (i.e., the c-axis direction). However, most of the piezoelectric materials are polycrystals of aggregates of grains, and the crystal axes of the respective grains extend in various different directions. Accordingly, the directions of the spontaneous polarizations Ps are various.

Now, in accordance with recent downsizing of electronic equipment, there have been strong demands also for the downsizing of a piezoelectric element. In order to meet the demands, a piezoelectric element in the form of a thin film, which has a remarkably smaller volume than a conventionally frequently used sintered body, has become used in more and more cases. Therefore, various developments and studies have been earnestly made for thinning the piezoelectric element.

For example, since the spontaneous polarization Ps of the PZT extends along the <001> axis direction, in order to achieve a PZT thin film with high piezoelectric properties (piezoelectric displacement properties), it is necessary to make the <001> axis of the crystal constituting a PZT thin film extend along the vertical direction to one face corresponding to one end thereof along the thickness direction of a substrate. For this purpose, in conventional technique, on a monocrystal substrate of magnesium oxide (MgO) with a rock-salt crystal structure having the (001) plane on a top face thereof, a PZT thin film with good crystallinity and with the <001> axis oriented vertically to one face corresponding to one end thereof is directly formed at a temperature of 600–700° C. by sputtering using PZT as a target (for example, see Japanese Laid-Open Publication No. 10-209517). This method is characterized by using the substrate of MgO monocrystal, and owing to this substrate, a piezoelectric thin film with high piezoelectric properties and preferred orientation along the crystal direction can be achieved.

The MgO monocrystal is, however, a very expensive material, and therefore, this method is not preferred from the viewpoint of cost when it is applied to mass production of industrial products of piezoelectric elements and the like using the piezoelectric thin film.

In contrast, as a method for forming the (001) plane or (100) plane crystal orientation film of a perovskite material such as PZT on an inexpensive substrate of silicon or the like, there have been known methods. The following method, i.e., a method disclosed in Japanese Patent Publication No. 3021930 is one of the examples, shows that by applying a PTZ precursor solution containing PZT or lanthanum onto a Pt electrode oriented along the (111) plane, thermally decomposing the precursor at a temperature of 450–550° C. and then thermally treating the precursor at 550–800° C. to crystallize the precursor (zol-gel method), a (100) plane crystal orientation film of PZT can be generated.

However, when a piezoelectric element is mass produced by the zol-gel method, crystallization is caused in the process step of removing an organism and the process step of heating an amorphous piezoelectric precursor film at a high temperature to crystallize the film, so that cracks and peelings between a lower electrode and a piezoelectric thin film occur in many cases.

In contrast, as a method for forming a crystal orientation film on an inexpensive substrate, a method for synthesizing the crystal orientation film not requiring a zol-gel method and employing, for example, sputtering is known (see, e.g., Japanese Laid-Open Publication No. 2004-79991). Now, procedures for forming a crystal orientation film by this method will be described. First, an electrode thin film made of a noble metal alloy of Pt or Ir including Co, Ni, Mn, Fe, or Cu is deposited on a substrate as an underlying electrode by sputtering. Next, PZT is deposited over the electrode thin film by sputtering. Thus, a PZT thin film with the (001) crystal orientation can be obtained.

The piezoelectric thin film formed in the aforementioned manner exhibits a large piezoelectric constant, and large piezoelectric displacement is caused even when the applied voltage is low. For this reason, such a piezoelectric thin film is expected to be used as an actuator in a variety of fields. Also, when a high voltage is applied to the piezoelectric thin film, even larger piezoelectric displacement can be caused.

However, when a voltage is applied to an actuator including a PZT thin film formed by sputtering for a long time in a high-temperature and high humidity atmosphere (at a temperature of 50° C. and a humidity of 50%), the amount of displacement is reduced and the electrode thin film is turned black, resulting in deterioration of the actuator. It can be considered that this is caused by a reaction of excessive Pb with water at an interface between the electrode thin film and the PZT thin film.

The present invention has been devised in view of the above-described point, and it is therefore an object of the present invention to provide, at low cost, a piezoelectric element having excellent piezoelectric properties and high moisture resistance, an inkjet head including the piezoelectric element, and an inkjet recording apparatus including the same.

SUMMARY OF THE INVENTION

To solve the above-described problems, a piezoelectric element according to the present invention is characterized in that the piezoelectric element includes: a first electrode film; a piezoelectric layered film including a first piezoelectric film formed on the first electrode film and a second piezoelectric film formed on the first piezoelectric film and controlled in crystal orientation thereof by the first piezoelectric film; and a second electrode film formed on the second piezoelectric film, and each of the first and second piezoelectric films is an aggregate of columnar grains grown unidirectionally along the thickness direction of the piezoelectric layered film, the first piezoelectric film has a smaller Pb content than a Pb content of the second piezoelectric film, a columnar grain of the second piezoelectric film has a larger average cross-sectional diameter than an average cross-sectional diameter of a columnar grain of the first piezoelectric film, and a ratio of a thickness of the piezoelectric layered film to the average cross-sectional diameter of the columnar grain of the second piezoelectric film is not less than 20 and not more than 60.

Thus, the Pb content of the first piezoelectric film is smaller than that of the second piezoelectric film. Accordingly, even if a voltage is applied to the piezoelectric element in a high-temperature, high-humidity atmosphere, deterioration of the piezoelectric element due to a reaction of excessive Pb of the first piezoelectric film with water at the interface between the first electrode film and the first piezoelectric film is not caused. Therefore, a piezoelectric element with excellent piezoelectric properties and high moisture resistance can be provided at low cost.

Moreover, another piezoelectric element according to the present invention is characterized in that the piezoelectric element includes: a first electrode film; an orientation controlling film formed on the first electrode film; a piezoelectric layered film including a first piezoelectric film formed on the orientation controlling film and a second piezoelectric film formed on the first piezoelectric film and controlled in crystal orientation thereof by the first piezoelectric film; and a second electrode film formed on the second piezoelectric film, and each of the first and second piezoelectric films is an aggregate of columnar grains grown unidirectionally along the thickness direction of the piezoelectric layered film, the first piezoelectric film has a smaller Pb content than a Pb content of the second piezoelectric film, a columnar grain of the second piezoelectric film has a larger average cross-sectional diameter than an average cross-sectional diameter of a columnar grain of the first piezoelectric film, and a ratio of a thickness of the piezoelectric layered film to the average cross-sectional diameter of the columnar grain of the second piezoelectric film is not less than 20 and not more than 60.

Thus, the Pb content of the first piezoelectric film is smaller than that of the second piezoelectric film. Accordingly, even if a voltage is applied to the piezoelectric element in a high-temperature, high-humidity atmosphere, deterioration of the piezoelectric element due to a reaction of excessive Pb of the first piezoelectric film with water at the interface between the orientation controlling film and the first piezoelectric film is not caused. Therefore, a piezoelectric element with excellent piezoelectric properties and high moisture resistance can be provided at low cost.

Moreover, with the orientation controlling film provided on the first electrode film, the crystal orientation of the first piezoelectric film can be improved and, furthermore, the crystal orientation of the second piezoelectric film can be improved. Therefore, a piezoelectric element with more excellent piezoelectric properties can be provided.

It is preferable that the columnar grain of the first piezoelectric film has an average cross-sectional diameter of not less than 40 nm and not more than 70 nm and a length of not less than 5 nm and not more than 100 nm.

Thus, the first piezoelectric film can reliably control the crystal orientation of the second piezoelectric film.

It is preferable that the columnar grain of the second piezoelectric film has an average cross-sectional diameter of not less than 60 nm and not more than 200 rin and a length of not less than 2500 nm and not more than 5000 nm.

When the length of a columnar grain of the second piezoelectric film is smaller than 2500 nm, an electric field applied to the piezoelectric layered film when a voltage is applied to between the first and second electrode films becomes larger, so that the possibility of the occurrence of cracks is increased.

According to the present invention, however, the length of a columnar grain of the second piezoelectric film is 2500 nm or more. Therefore, the occurrence of cracks can be prevented.

It is preferable that each of the first and second piezoelectric films includes at least Pb, Zr and Ti in a chemical composition ratio of Pb:Zr:Ti of $(1+a):b:(1-b)$, the b of each of the first and second piezoelectric films takes the same value, i.e., a value of not less than 0.50 and not more than 0.60, the a of the first piezoelectric film takes a value of not less than $-0.05$ and not more than 0.05, and the a of the second piezoelectric film takes a value of not less than 0 and not more than 0.1.

Thus, humidity resistance of the piezoelectric element can be reliably improved.

It is preferable that each of the first and second piezoelectric films is preferentially oriented along the (001) plane.

It is preferable that the first electrode film is made of a noble metal selected from the group consisting of Pt, Ir, Pd and Ru, an alloy of the noble metal and at least a metal selected from the group of Ti, Co, Ni, Al, Fe, Mn, Cu, Mg, Ca, Sr and Ba or an oxide of the metal and is an aggregate of columnar grains each having an average cross-sectional diameter of not less than 20 nm and not more than 30 nm.

Thus, the first electrode film can activate its function as an orientation control film for controlling the orientation of the first piezoelectric film. Accordingly, the first piezoelectric film can reliably control the crystal orientation of the second piezoelectric film.

It is preferable that the orientation controlling film is made of lead lanthanum titanate.

Thus, the piezoelectric layered film can be reliably oriented along the (001) plane.

A method for fabricating a piezoelectric element according to the present invention is characterized by including the steps of: depositing a first electrode film on a substrate by sputtering; depositing a first piezoelectric film on the first electrode film by sputtering performed using a predetermined material as a target under a predetermined deposition condition; depositing a second piezoelectric film on the first piezoelectric film by sputtering performed using the predetermined material as a target under a different deposition condition from the predetermined deposition condition; and depositing a second electrode film on the second piezoelectric film.

Moreover, another method for fabricating a piezoelectric element according to the present invention is characterized by including the steps of: depositing a first electrode film on a substrate by sputtering; depositing an orientation controlling film on the first electrode film by sputtering performed using a first material as a target under a first deposition condition; depositing a first piezoelectric film on the orientation controlling film by sputtering performed using a second material as a target under a second deposition condition; depositing a second piezoelectric film on the first piezoelectric film by sputtering performed using the second material as a target under a different deposition condition from the second deposition condition; and depositing a second electrode film on the second piezoelectric film.

It is preferable that the step of depositing a second piezoelectric film is performed in an atmosphere containing a larger amount of oxygen than the amount of oxygen contained in an atmosphere used in the step of depositing a first piezoelectric film.

An inkjet head according to the present invention is characterized in that the inkjet head includes: a head body including a nozzle and a pressure chamber, communicated with the nozzle, for containing an ink; a diaphragm film provided so that part of one face of the diaphragm film corresponding to one end thereof along the thickness direction of the diaphragm film faces the pressure chamber; and a piezoelectric element, formed on the other face of the diaphragm film corresponding to the other end thereof along the thickness direction of the diaphragm film, for applying a pressure to the ink contained in the pressure chamber to discharge the ink from the nozzle, the piezoelectric element includes a first electrode film, a piezoelectric layered film including a first piezoelectric film formed on the first electrode film and a second piezoelectric film formed on the first piezoelectric film and controlled in crystal orientation thereof by the first piezoelectric film, and a second electrode film formed on the second piezoelectric film, each of the first and second piezoelectric films is an aggregate of columnar grains grown unidirectionally along the thickness direction of the piezoelectric layered film, the first piezoelectric film has a smaller Pb content than a Pb content of the second piezoelectric film, a columnar grain of the second piezoelectric film has a larger average cross-sectional diameter than an average cross-section of a columnar grain of the first piezoelectric film, and a ratio of a thickness of the piezoelectric layered film to the average cross-sectional diameter of the columnar grain of the second piezoelectric film is not less than 20 and not more than 60.

Another inkjet head according to the present invention is characterized in that the inkjet head includes: a head body including a nozzle and a pressure chamber, communicated with the nozzle, for containing an ink; a diaphragm film provided so that part of one face of the diaphragm film corresponding to one end thereof along the thickness direction of the diaphragm film faces the pressure chamber; and a piezoelectric element, formed on the other face of the diaphragm film corresponding to the other end thereof along the thickness direction of the diaphragm film, for applying a pressure to the ink contained in the pressure chamber to discharge the ink from the nozzle, the piezoelectric element includes a first electrode film, a piezoelectric layered film including an orientation controlling film formed on the first electrode film, a first piezoelectric film formed on the orientation controlling film and a second piezoelectric film formed on the first piezoelectric film and controlled in crystal orientation thereof by the first piezoelectric film, and a second electrode film formed on the second piezoelectric film, each of the first and second piezoelectric films is an aggregate of columnar grains grown unidirectionally along the thickness direction of the piezoelectric layered film, the first piezoelectric film has a smaller Pb content than a Pb content of the second piezoelectric film, a columnar grain of the second piezoelectric film has a larger average cross-sectional diameter than an average cross-section of a columnar grain of the first piezoelectric film, and a ratio of a thickness of the piezoelectric layered film to the average cross-sectional diameter of the columnar grain of the second piezoelectric film is not less than 20 and not more than 60.

A method for fabricating an inkjet head according to the present invention is characterized by including the steps of: depositing a first electrode film on a substrate by sputtering; depositing a first piezoelectric film on the first electrode film by sputtering performed using a predetermined material as a target under a predetermined deposition condition; depositing a second piezoelectric film on the first piezoelectric film by sputtering performed using the predetermined material as a target under a different deposition condition from the predetermined deposition condition; depositing a second electrode film on the second piezoelectric film by sputtering; depositing a diaphragm film on the second electrode film by sputtering; joining a head body onto the diaphragm film; removing the substrate by etching; patterning the first electrode film and the first piezoelectric film by dry etching so that each of the first electrode film and the first piezoelectric film corresponds to a position of the pressure chamber; and patterning the second piezoelectric film by wet etching.

It is preferable that in the step of patterning the first electrode film and the first piezoelectric film, patterning is performed by dry etching using a gas containing a halogen element or a mixture of a gas containing a halogen element and an inert gas.

Moreover, another method for fabricating an inkjet head according to the present invention is characterized by including: depositing a first electrode film on a substrate by sputtering; depositing an orientation controlling film on the first electrode film by sputtering using a first material as a target under a first deposition condition; depositing a first piezoelectric film on the orientation controlling film by sputtering performed using a second material as a target under a second deposition condition; depositing a second piezoelectric film on the first piezoelectric film by sputtering performed using the second material as a target under a different deposition condition from the second deposition condition; depositing a second electrode film on the second piezoelectric film; depositing a diaphragm film on the second electrode film by sputtering; joining a head body onto the diaphragm film; removing the substrate by etching; patterning the first electrode film, the orientation controlling film and the first piezoelectric film by dry etching so that each of the first electrode film, the orientation controlling film and the first piezoelectric film corresponds to a position of the pressure chamber; and patterning the second piezoelectric film by wet etching.

It is preferable that in the step of patterning the first electrode film, the orientation controlling film and the first piezoelectric film, patterning is performed by dry etching using a gas containing a halogen element or a mixture of a gas containing a halogen element and an inert gas.

It is preferable that in the step of patterning the second piezoelectric film, patterning is performed by wet etching using an etchant containing a mixture of hydrofluoric acid and nitric acid as a main component.

An inkjet recording apparatus according to the present invention is characterized in that the inkjet recording apparatus includes: an inkjet head; and moving means for making the inkjet head and a recording medium, the inkjet head includes a head body including a nozzle and a pressure chamber, communicated with the nozzle, for containing an ink, a diaphragm film provided so that part of one face of the diaphragm film corresponding to one end thereof along the thickness direction of the diaphragm film faces the pressure chamber, and a piezoelectric element, formed on the other face of the diaphragm film corresponding to the other end thereof along the thickness direction of the diaphragm film, for applying a pressure to the ink contained in the pressure chamber to discharge the ink from the nozzle, the piezoelectric element includes a first electrode film, a piezoelectric layered film including a first piezoelectric film formed on the first electrode film and a second piezoelectric film formed on the first piezoelectric film and controlled in crystal orientation thereof by the first piezoelectric film, and a second electrode film formed on the second piezoelectric film, each of the first and second piezoelectric films is an aggregate of columnar grains grown unidirectionally along the thickness direction of the piezoelectric layered film, the first piezoelectric film has a smaller Pb content than a Pb content of the second piezoelectric film, a columnar grain of the second piezoelectric film has a larger average cross-sectional diameter than an average cross-sectional diameter of a columnar grain of the first piezoelectric film, and a ratio of a thickness of the piezoelectric layered film to the average cross-sectional diameter of the columnar grain of the second piezoelectric film is not less than 20 and not more than 60.

Another inkjet recording apparatus according to the present invention is characterized in that the inkjet recording apparatus includes: an inkjet head; and moving means for making the inkjet head and a recording medium move relative to each other, the inkjet head includes a head body including a nozzle and a pressure chamber, communicated with the nozzle, for containing an ink, a diaphragm film provided so that part of one face of the diaphragm film corresponding one end thereof along the thickness direction of the diaphragm film faces the pressure chamber, and a piezoelectric element, formed on the other face of the diaphragm film corresponding to the other end thereof along the thickness direction of the diaphragm film, for applying a pressure to the ink contained in the pressure chamber to discharge the ink from the nozzle, the piezoelectric element includes a first electrode film, a piezoelectric layered film including an orientation controlling film formed on the first electrode film, a first piezoelectric film formed on the orientation controlling film and a second piezoelectric film formed on the first piezoelectric film and controlled in crystal orientation thereof by the first piezoelectric film, and a second electrode film formed on the second piezoelectric film, each of the first and second piezoelectric films is an aggregate of columnar grains grown unidirectionally along the thickness direction of the piezoelectric layered film, the first piezoelectric film has a smaller Pb content than a Pb content of the second piezoelectric film, a columnar grain of the second piezoelectric film has a larger average cross-sectional diameter than an average cross-section of a columnar grain of the first piezoelectric film, and a ratio of a thickness of the piezoelectric layered film to the average cross-sectional diameter of the columnar grain of the second piezoelectric film is not less than 20 and not more than 60.

Note that a piezoelectric element according to the present invention is applicable to not only an inkjet head and an inkjet recording apparatus but also an electronic component such as a gyrostabilizer and an acceleration sensor, and the like.

According to the present invention, even if a voltage is applied to a piezoelectric element in a high-temperature, high humidity atmosphere, the piezoelectric element is not deteriorated. Therefore, a piezoelectric element with excellent piezoelectric properties and high resistance against humidity and an inkjet and inkjet recording apparatus including the piezoelectric element can be provided at low cost. Moreover, a piezoelectric element with excellent piezoelectric properties and high resistance against humidity can be fabricated in a simple manner. Furthermore, an inkjet head and an inkjet recording apparatus with a small variation in an ink discharging ability and also with high reliability can be provided.

DESCRIPTION OF THE PREFERRED EMBODIMENTS

Hereinafter, embodiments of the present invention will be described in detail with reference to the accompanying drawings.

(Embodiment 1)

Figure 1:
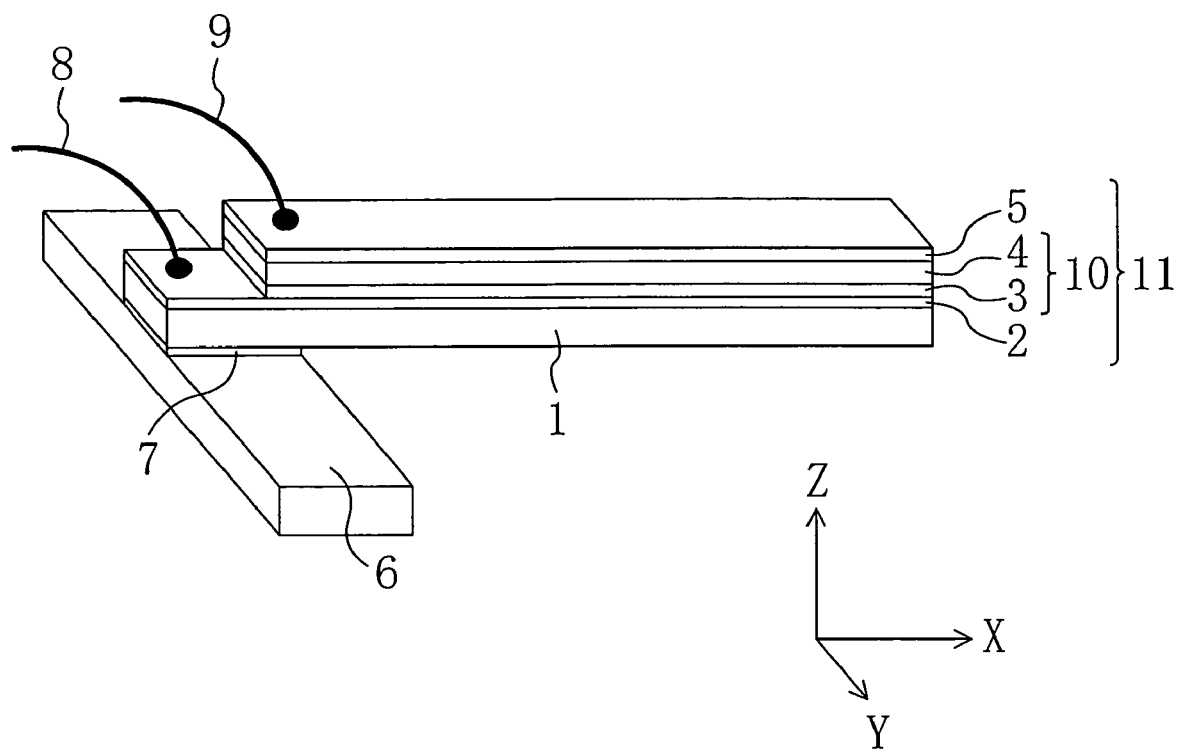
FIG. 1 is a perspective view of a piezoelectric element according to an embodiment of the present invention.

As shown in FIG. 1, a piezoelectric element 20 according to EMBODIMENT 1 of the present invention includes a substrate 1 in the shape of a strip plate (with a thickness of 0.3 mm, a width of 3.0 mm and a length of 15.0 mm) and a layered body 11 formed on the substrate 1. The piezoelectric element 20 has a width of 3.0 mm. One end portion of the piezoelectric element 20 (that is, the left end portion in FIG. 1) is fixed onto a stainless steel supporting substrate 6 (with a thickness of 1.0 mm, a width of 3.0 mm and a length of 10.0 mm) with an epoxy resin adhesive 7 interposed therebetween. The end portion herein means a portion of the piezoelectric element 20 extending inwardly from the end of the piezoelectric element 20 (that is, the left end in FIG. 1) by a length of 3.0 mm. The longitudinal direction of the piezoelectric element 20 is substantially perpendicular to the longitudinal direction of the stainless steel supporting substrate 6. Thus, the piezoelectric element 20 is constructed as a cantilever.

The substrate 1 also works as a diaphragm film (diaphragm layer) for inhibiting expansion and contraction of the layered body 11 caused by the piezoelectric effect. The layered body 11 includes a first electrode film 2 formed on the substrate 1, a piezoelectric layered film 10 formed on the first electrode film 2 and a second electrode film 5 formed on the piezoelectric layered film 10.

The first electrode film 2 is formed over one face of the substrate 1 corresponding to one end thereof along the thickness direction of the substrate 1. The piezoelectric layered film 10 is formed on the first electrode film 2 excluding a portion above the aforementioned end portion. Specifically, the piezoelectric layered film 10 has a width of 3.0 mm and a length of 12.0 mm. The piezoelectric layered film 10 is made of lead zirconate titanate-based oxide (hereinafter refereed to as the PZT-based oxide) with the perovskite type crystal structure with (001) preferred orientation. The PZT-based oxide is an oxide including at least Pb, Zr and Ti. More specifically, the piezoelectric layered film 10 includes a first piezoelectric thin film 3 formed on the first electrode film 2 and a second piezoelectric thin film 4 formed on the first piezoelectric thin film 3. The first piezoelectric thin film 3 has a function as an orientation controlling film for controlling the crystal orientation of the second piezoelectric thin film 4.

The second electrode film 5 is made of platinum (Pt) with a thickness of 100 nm. The first and second electrode films 2 and 5 are connected to gold leads 8 and 9, respectively.

Figure 3:
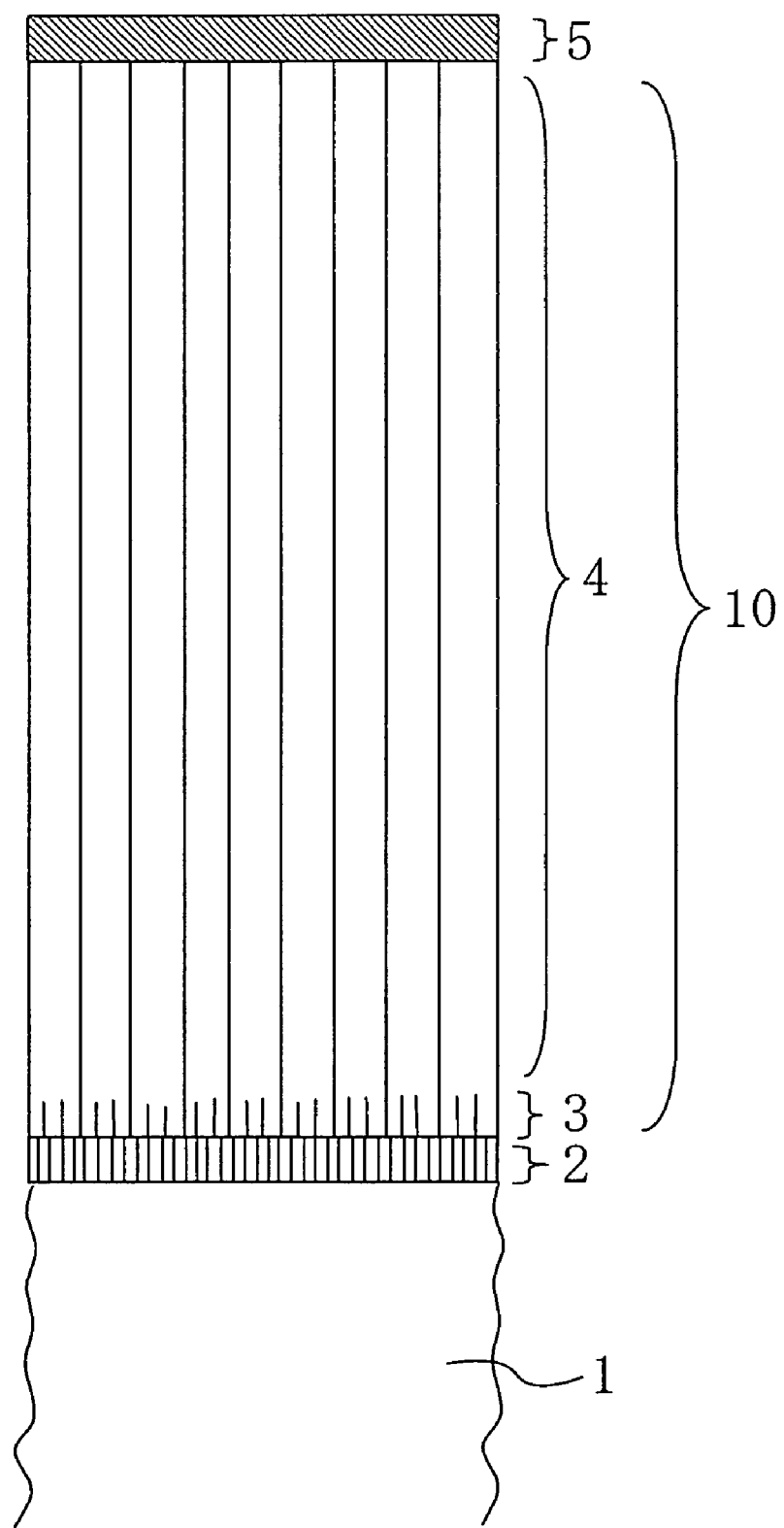
FIG. 3 is a view schematically illustrating the film structure of the piezoelectric element.

As a characteristic of the present invention, each of the first and second piezoelectric thin films 3 and 4 is an aggregate of columnar grains having a crystal growth direction unidirectionally along the thickness direction of the piezoelectric layered film 10 (the first and second piezoelectric thin films 3 and 4) (see FIG. 3). In other words, each of the first and second piezoelectric thin films 3 and 4 is an aggregate of columnar grains grown along the vertical direction to a plane corresponding to one end thereof along the thickness direction of the substrate 1 (the first electrode film 2). The columnar grains of the first and second piezoelectric thin films 3 and 4 are continuously linked to each other. The Pb content of the first piezoelectric thin film 3 is smaller than the Pb content of the second piezoelectric thin film 4. Also, the average cross-sectional diameter (grain size) of the columnar grain of the second piezoelectric thin film 4 is larger than the average cross-sectional diameter (grain size) of the columnar grain of the first piezoelectric thin film 3. The ratio of the thickness of the piezoelectric layered film 10 (i.e., the length of the columnar grain of the piezoelectric layered film 10) to the average cross-sectional diameter of the columnar grain of the second piezoelectric thin film 4 is not less than 20 and not more than 60. When the ratio of the thickness of the piezoelectric layered film 10 to the average cross-sectional diameter of the columnar grain of the second piezoelectric thin film 4 is smaller than 20, cracks are disadvantageously caused in the piezoelectric layered film 10 due to stress caused in deposition, and when the ratio exceeds 60, the responsibility is disadvantageously lowered because power consumed in driving is large. Either case is not preferable.

The columnar grain of the first piezoelectric thin film 3 has an average cross-sectional diameter (grain size) of not less than 40 nm and not more than 70 nm and a length of not less than 5 nm and not more than 100 nm. The columnar grain of the second piezoelectric thin film 4 has an average cross-sectional diameter of not less than 60 nm and not more than 200 nm and a length of not less than 2500 nm and not more than 5000 nm.

Also, for each of the first and second piezoelectric thin films 3 and 4, a chemical composition ratio of Pb:Zr:Ti is represented by (1+a):b:(1−b). The value b is the same, i.e., a value of not less than 0.50 and not more than 0.60 for the first and second piezoelectric thin films 3 and 4. The value a is not less than −0.05 and not more than 0.05 in the first piezoelectric thin film 3 and is not less than 0 and not more than 0.10 in the second piezoelectric thin film 4.

Moreover, the first electrode film 2 is made of at least a noble metal selected from the group consisting of Pt, Ir, Pd and Ru, or an alloy of the noble metal and at least a metal selected from the group consisting of Ti, Co, Ni, Al, Fe, Mn, Cu, Mg, Ca, Sr and Ba or an oxide of the metal, and is an aggregate of columnar grains having an average cross-sectional diameter of not less than 20 nm and not more than 30 nm.

When a voltage is applied to the first and second electrode films 2 and 5 of the piezoelectric element 20 through the leads 8 and 9, the piezoelectric layered film 10 extends along the X-axis direction. Assuming that a voltage E (V) is applied and the piezoelectric layered film 10 has a length L (m), a thickness t (m) and a piezoelectric constant $d_{31}$ (pm/V), the expansion amount ΔL (m) of the piezoelectric layered film 10 along the X-axis direction is obtained by the following Equation 1.

$$\Delta L = d_{31} \times L \times E / t \quad \text{[Equation 1]}$$

Also, an upper portion of the piezoelectric layered film 10 jointed to the second electrode film 5 extends along the X-axis direction but the expansion of a lower portion of the piezoelectric layered film 10 jointed to the first electrode film 2 is suppressed by the substrate 1 with a large thickness. As a result, the other end opposing to the aforementioned one end (i.e., the right end in FIG. 1; hereinafter referred to as the tip) is displaced in the −Z direction along the Z-axis (i.e., downward in FIG. 1). Accordingly, when voltage application is repeated at constant periods, the tip of the piezoelectric element 20 is displaced in the Z-axis direction with a predetermined displacement amount. By examining the relationship between the applied voltage and an displacement amount of the tip of the piezoelectric element 20, the displacement property of the piezoelectric element 20 can be evaluated.

Method for Fabricating Piezoelectric Element

Figure 2A:
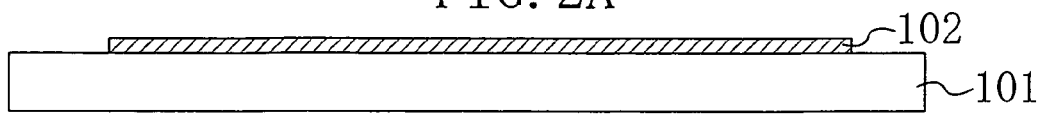
FIGS. 2A, 2B, 2C, 2D and 2E are cross-sectional views illustrating respective steps for fabricating the piezoelectric element.

Now, a method for fabricating the piezoelectric element 20 will be described with reference to FIGS. 2A through 2E. First, as shown in FIG. 2A, a first electrode film 102 is deposited on a silicon substrate 101 having a length of 20 mm, a width of 20 mm and a thickness of 0.3 mm by rf-magnetron sputtering using a stainless steel mask (with a thickness of 0.2 mm) having a rectangular opening with a width of 5.0 mm and a length of 18.0 mm.

Next, a piezoelectric layered film 110 is accurately deposited on the first electrode film 102 by rf-magnetron sputtering using a stainless steel mask (with a thickness of 0.2 mm) having a rectangular opening with a width of 5.0 mm and a length of 12.0 mm. Specifically, the piezoelectric layered film 110 is deposited as follows. First, a first piezoelectric thin film 103 is deposited on the first electrode film 102 by rf-magnetron sputtering performed under a predetermined deposition condition using a sintered body of a PZT oxide as a predetermined target. Then, a second piezoelectric thin film 104 is continuously deposited on the first piezoelectric thin film 103 by rf-magnetron sputtering performed under a different deposition condition from that employed for forming the first piezoelectric thin film 103 and using the same target as that used in forming the first piezoelectric thin film 103.

Figure 2B:
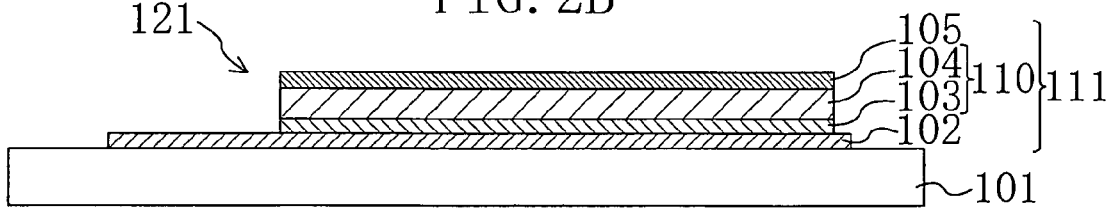

Next, a second electrode film 105 is accurately deposited on the piezoelectric layered film 110 by rf-magnetron sputtering using the same mask. As a result, as shown in FIG. 2B, a structure 121 composed of the substrate 101 and a layered body 111 including the piezoelectric layered film 110 formed on the substrate 101 can be obtained.

Figure 2C:
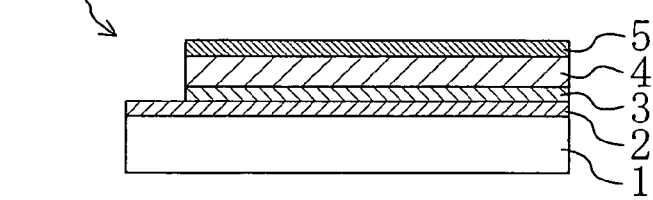

Next, as shown in FIG. 2C, the structure 121 is cut with a dicing saw so that the substrate 1 has a strip shape with a width of 3.0 mm and a length of 15.0 mm and a portion of a first electrode film 2 extending from one end (i.e., the left end in FIG. 2C) thereof by a length of 3.0 mm is exposed. As a result, a piezoelectric element structure component 22 in which the substrate 1, the first electrode film 2, a first piezoelectric thin film 3, a second piezoelectric thin film 4 and a second electrode film 5 are stacked in this order can be obtained.

Figure 2D:
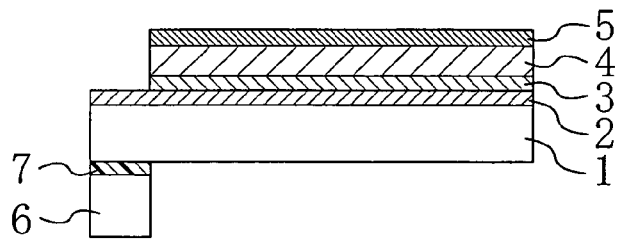

Then, as shown in FIG. 2D, a portion of the substrate 1 (i.e., the left end portion in FIG. 2D) corresponding to the exposed portion of the first electrode film 2 is jointed on a stainless steel supporting substrate 6 with an epoxy resin adhesive 7.

Figure 2E:
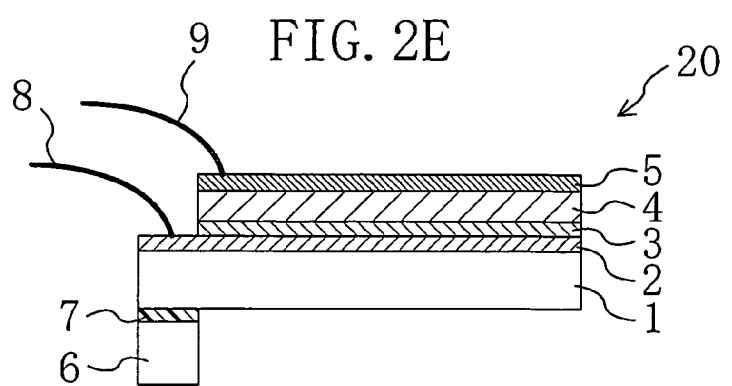

Next, as shown in FIG. 2E, a lead 8 is connected to the exposed portion of the first electrode 2 with a conductive adhesive (conductive paste containing silver), and a lead 9 is connected to a portion of the second electrode film 5 located closer to the exposed portion of the first electrode film 2 by wire bonding. Thus, the piezoelectric element 20 shown in FIG. 1 can be obtained. FIG. 3 is a view schematically illustrating the film structure of the piezoelectric element 20.

Now, specifically practiced examples will be described.

EXAMPLE 1

In this example, a silicon substrate was used as the substrate 101 and a Pt thin film with a thickness of 100 nm was used as the first electrode film 102. The Pt thin film was deposited using a ternary rf-magnetron sputtering system. Specifically, the silicon substrate 101 was previously annealed to 400° C. and was kept at the temperature. A mixed gas of argon and oxygen (with a gas volume ratio of $Ar/O_2=15/1$) was used as a sputtering gas and a total gas pressure was kept at 0.25 Pa. A target of Pt was used as a first target of the ternary rf magnetron sputtering system. Then, with high frequency power of 200 W applied, sputtering is performed for 1200 seconds, thereby depositing the Pt thin film.

The thickness of the piezoelectric layered film 110 was set to be 3100 nm. The piezoelectric layered film 110 includes a first piezoelectric thin film 103 made of lead zirconate titanate (hereinafter referred to PZT) with the (001) preferred orientation and having a thickness of 100 nm and a second piezoelectric thin film 104 formed on the first piezoelectric thin film 103, made of PZT with the (001) preferred orientation and having a thickness of 3000 nm.

The first and second piezoelectric thin films 103 and 104 were deposited using an rf-magnetron sputtering system (as shown in FIG. 2B). At this point, a sintered body with a diameter of 6 inches and of lead zirconate titanate (PZT) with a stoichiometric composition prepared by excessively adding approximately 20 mol % of PbO (having a composition molar ratio of Pb:Zr:Ti of 1.20:0.53:0.47) was used as a target. Also, the first and second piezoelectric thin films 103 and 104 were deposited under the following conditions.

In a deposition chamber provided with the target, the silicon substrate 101 having the first electrode film 102 on one face thereof was previously annealed to 580° C. and the substrate was kept at the temperature. A mixed gas of argon and oxygen (with a gas volume ratio of $Ar/O_2=79/1$) was used as a sputtering gas, and the gas pressure and the flow rate of the gas were set to be 0.2 Pa and 40 ml/min., respectively. With plasma generating power set to be 3 kW, the first piezoelectric thin film 103 was deposited for 50 seconds. Thereafter, the deposition was once stopped, of the above-described deposition conditions, only the gas volume ratio of the sputtering gas was changed to $Ar/O_2=38/2$ and, without changing the other deposition conditions, the second piezoelectric thin film 104 was deposited for 3000 seconds.

In this case, to accurately obtain the composition, film thickness and cross-sectional structure of the first piezoelectric thin film 103 of FIG. 2B, another layered film was also prepared as a sample by ending the deposition after forming the first piezoelectric thin film 103. This sample was observed on its surface with a scanning electron microscope and analyzed in its composition by X-ray microanalyzer. Thereafter, the sample was broken, and the resultant broken-out section was observed with a scanning electron microscope.

Also, to accurately obtain the composition, film thickness and cross-sectional structure of the first piezoelectric thin film 104 of FIG. 2B, another layered film was also prepared as a sample by ending the deposition after forming the first piezoelectric thin film 104. This sample was observed on its surface with a scanning electron microscope and analyzed in its composition by X-ray microanalyzer. Thereafter, the sample was broken, and the resultant broken-out section was observed with a scanning electron microscope.

Moreover, using the structure 121 of FIG. 2B as a sample, the composition of the piezoelectric layered film 110 along the thickness direction was analyzed through Auger analysis. Furthermore, a broken-out section of the piezoelectric layered film 110 was observed with a scanning electron microscope.

As a result of the aforementioned analyses and observations, the Pt electrode used as the first electrode film 102 was found to be an aggregate of columnar grains (columnar crystal) with an average grain size (average diameter) of 20 nm. The first and second piezoelectric thin films 103 and 104 were present as aggregates of columnar grains mutually continuously linked. The first piezoelectric thin film 103 had a thickness of 100 nm, and the average grain size (average diameter) of its columnar grain was 40 mm. The second piezoelectric thin film 104 had a thickness of 3000 nm, and the average grain size (average diameter) of its columnar grain was 100 nm. The ratio of the thickness of the piezoelectric layered film 110 to the average grain size (average diameter) of the columnar grain of the second piezoelectric thin film 104 was 31.

Furthermore, as a result of the analysis by X-ray diffraction, the first and second piezoelectric films 103 and 104 were found to have the perovskite type crystal structure. The (001) crystal orientation ratio of deposition face of the first piezoelectric film 103 was 55% and the (001) crystal orientation ratio of deposition face of the second piezoelectric film 104 was 75%. In this case, the (001) crystal orientation ratio α is defined by the following Equation 2.

$$\alpha=I(001)/\Sigma I(hkl) \quad \text{[Equation 2]}$$

where Σ(hkl) is a total sum of all of diffraction intensities of a perovskite type oxide obtained in X-ray diffraction when 2θ in the case of using a Cu—Kα line is 10–70 degrees.

Furthermore, as a result of the composition analysis of cation by the X-ray microanalyzer, the composition ratios of Pb:Zr:Ti of the first piezoelectric thin film 103 and the second piezoelectric thin film 104 were found to be 0.95:0.53:0.47 and 1.00:0.53:0.47, respectively. That is, each of the first and second piezoelectric thin films 103 and 104 was found to be a PZT film having the perovskite type crystal structure with the (001) axis grown preferentially oriented along the vertical direction to the top face of the substrate 101. It was also found that the composition ratios of Zr and Ti in the first and second piezoelectric thin films 103 and 104 were the same, but the composition ratio of Pb was smaller in the first piezoelectric thin film 103 than in the second piezoelectric thin film 104.

Figure 4:
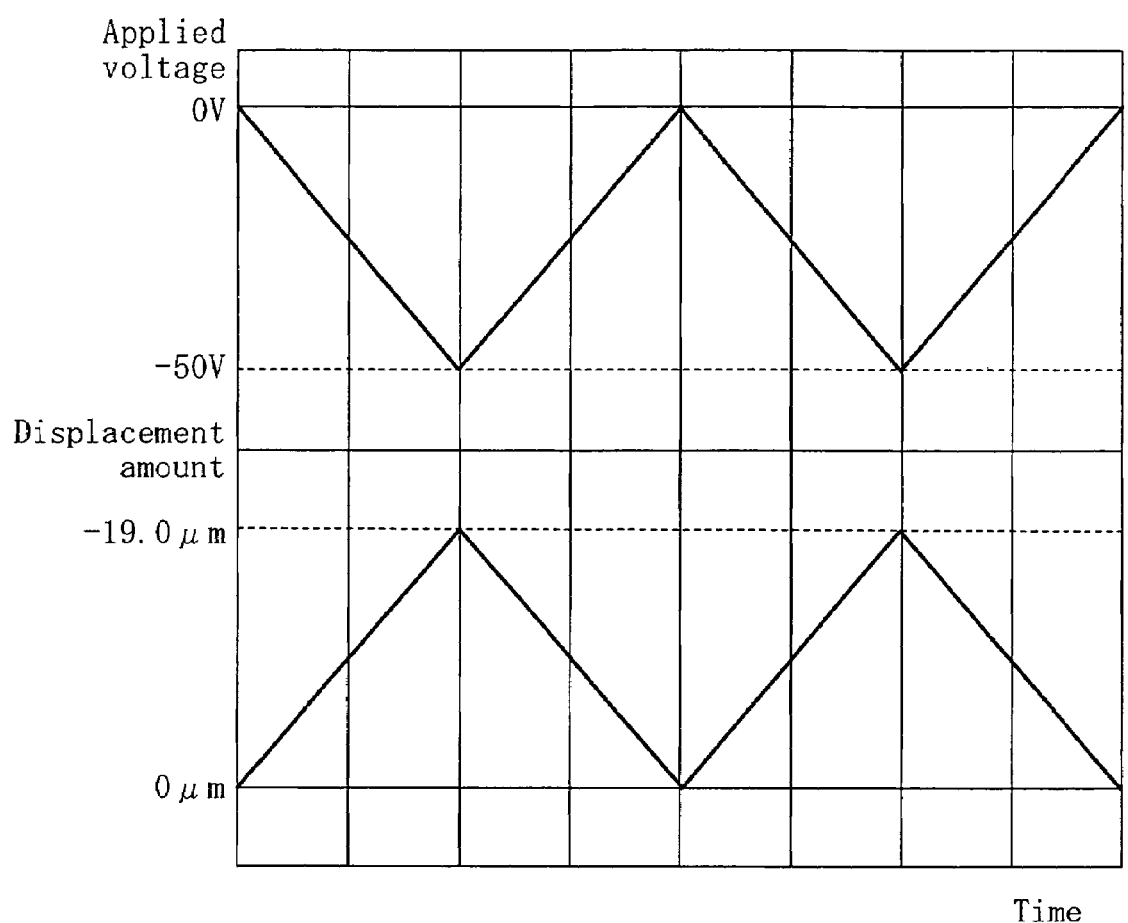
FIG. 4 is a graph showing displacement amount of a tip of the piezoelectric element along the Z-axis direction when a triangle wave voltage with a frequency of 2 kHz is applied thereto.

Moreover, a triangle wave voltage of 0 V to −50 V was applied to between the first and second electrode films 2 and 5 through the leads 8 and 9 to measure the displacement amount of the tip of the piezoelectric element 20 along the Z-axis direction using a laser Doppler vibrometer. FIG. 4 shows the displacement amount along the Z-axis direction of the tip of the piezoelectric element 20 obtained with a triangle wave voltage of a frequency of 2 kHz applied. From a result of the measurement, it was found that the tip of the piezoelectric element 20 was displaced by 19.0 μm at most.

Moreover, after the piezoelectric element 20 was continuously driven by the triangle wave voltage for 120 hours in a high-temperature, high-humidity atmosphere (at a temperature of 50° C. and a humidity of 50%), a driving state of the piezoelectric element 20 was examined and also the appearance of the piezoelectric element 20 was examined using an optical microscope. As a result, even after the piezoelectric element 20 was continuously driven in a high-temperature, high-humidity atmosphere for 120 hours, the displacement amount was 19.0 μm at most, reduction in the displacement amount was not observed and also change in the color of the first electrode film 2 was not observed either.

EXAMPLE 2

In this example, a silicon substrate was used as the substrate 101 and an Ir—Ti alloy thin film with a thickness of 120 nm was used as the first electrode film 102. The Ir—Ti film was deposited using a ternary rf-magnetron sputtering system. Specifically, the silicon substrate 101 was previously annealed to 400° C. and was kept at the temperature. A mixed gas of argon and oxygen (with a gas volume ratio of $Ar/O_2=15/1$) was used as a sputtering gas and a total gas pressure was kept at 0.25 Pa. A target of Ir and a target of titanium were used as first and second targets of the ternary rf magnetron sputtering system, respectively. Then, with high frequency powers of 200 W and 600 W applied to the first and second targets, respectively, sputtering was performed for 1200 seconds, thereby depositing the Ir—Ti thin film.

The thickness of the piezoelectric layered film 110 was set to be 2550 nm. The piezoelectric layered film 110 was formed of a first piezoelectric thin film 103 made of PZT with the (001) preferred orientation and having a thickness of 50 nm and a second piezoelectric thin film 104 formed on the first piezoelectric thin film 103, made of PZT with the (001) preferred orientation and having a thickness of 2500 nm.

In this example, the first and second piezoelectric thin films 103 and 104 were deposited using an rf-magnetron sputtering system (see FIG. 2B). At this point, a sintered body with a diameter of 6 inches of lead zirconate titanate (PZT) with a stoichiometric composition prepared by excessively adding approximately 20 mol % of PbO (having a composition molar ratio of Pb:Zr:Ti of 1.20:0.50:0.50) was used as a target. Also, the first and second piezoelectric thin films 103 and 104 were deposited under the following conditions. In a deposition chamber provided with the target, the substrate 101 having the first electrode film 102 on one face thereof was previously annealed to 580° C. and the substrate was kept at the temperature. A mixed gas of argon and oxygen (with a gas volume ratio of $Ar/O_2=79/1$) was used as a sputtering gas, and the gas pressure and the flow rate of the gas were set to be 0.2 Pa and 40 ml/min., respectively. With plasma generating power set to be 3 kW, the first piezoelectric thin film 103 was deposited for 40 seconds. Thereafter, the deposition was once stopped, of the above-described deposition conditions, only the gas volume ratio of sputtering gas was changed to $Ar/O_2=38/2$ and, without changing the other deposition conditions, the second piezoelectric thin film 104 was deposited for 2400 seconds.

As a result of the same analyses and observations as those carried out in Example 1, the Ir—Ti electrode used as the first electrode film 102 was found to be an Ir thin film containing titanium at a composition of 3% and also an aggregate of columnar grains (columnar crystal) with an average grain size (average diameter) of 30 nm. The first and second piezoelectric thin films 103 and 104 were present as aggregates of columnar grains mutually continuously linked. The first piezoelectric thin film 103 had a thickness of 50 nm, and the average grain size (average diameter) of its columnar grain was 40 nm. The second piezoelectric film 104 had a thickness of 2500 nm, and the average grain size (average diameter) of its columnar grain was 80 nm. The ratio of the thickness of the piezoelectric layered film 110 to the average grain size (average diameter) of the columnar grain of the second piezoelectric thin film 104 was 31.9.

Moreover, as a result of the analysis by X-ray diffraction, the first and second piezoelectric films 103 and 104 were found to have the perovskite type crystal structure. The (001) crystal orientation ratio on the deposited face of the first piezoelectric film 103 was 60%, and the (001) crystal orientation ratio on the deposited face of the second piezoelectric film 104 was 80%.

Furthermore, as a result of the composition analysis of cation using the X-ray microanalyzer, the composition ratios of Pb:Zr:Ti of the first piezoelectric thin film 103 and the second piezoelectric thin film 104 were found to be 1.00:0.50:0.50 and 1.10:0.50:0.50, respectively. That is, each of the first and second piezoelectric thin films 103 and 104 was found to be a PZT film having the perovskite type crystal structure with the (001) axis grown preferentially oriented along the vertical direction to the top face of the substrate 101. It was also found that the composition ratios of Zr and Ti in the first and second piezoelectric thin films 103 and 104 were the same, but the composition ratio of Pb was smaller in the first piezoelectric thin film 103 than in the second piezoelectric thin film 104.

Moreover, as in Example 1, a triangle wave voltage of 0 V to −50 V was applied to between the first and second electrode films 2 and 5 through the leads 8 and 9 to measure the displacement amount of the tip of the piezoelectric element 20 along the Z-axis direction using a laser Doppler vibrometer. From a result of measurement, it was found that the tip of the piezoelectric element 20 was displaced by 23.9 μm at most.

Moreover, after the piezoelectric element 20 was continuously driven by the triangle wave voltage for 120 hours in a high-temperature, high-humidity atmosphere (at a temperature of 50° C. and a humidity of 50%), a driving state of the piezoelectric element 20 was examined and also the appearance of the piezoelectric element 20 was examined using an optical microscope. As a result, even after the piezoelectric element 20 was continuously driven in a high-temperature, high-humidity atmosphere for 120 hours, the displacement amount was 23.9 μm at most, reduction in the displacement amount was not observed and also change in the color of the first electrode film 2 was not observed either.

EXAMPLE 3

In this example, a silicon substrate was used as the substrate 101 and a Pd thin film with a thickness of 150 nm was used as the first electrode film 102. The Pd film was deposited using a ternary rf-magnetron sputtering system. Specifically, the silicon substrate 101 was previously annealed to 400° C. and was kept at the temperature. A mixed gas of argon and oxygen (with a gas volume ratio of $Ar/O_2=15/1$) was used as a sputtering gas and a total gas pressure was kept at 0.25 Pa. A target of Pd was used as a first target of the ternary rf magnetron sputtering system. Then, with high frequency power of 200 W applied to the first target, sputtering was performed for 1200 seconds, thereby depositing the Pd thin film as the first electrode film 102.

The thickness of the piezoelectric layered film 110 was set to be 3100 nm. The piezoelectric layered film 110 was formed of a first piezoelectric thin film 103 made of PZT with the (001) preferred orientation and having a thickness of 100 nm and a second piezoelectric thin film 104 formed on the first piezoelectric thin film 103, made of PZT with the (001) preferred orientation, and having a thickness of 3000 nm.

The first and second piezoelectric thin films 103 and 104 were deposited using an rf-magnetron sputtering system (see FIG. 2B). At this point, a sintered body with a diameter of 6 inches of lead zirconate titanate (PZT) with a stoichiometric composition prepared by excessively adding approximately 20 mol % of PbO (having a composition molar ratio of Pb:Zr:Ti of 1.20:0.60:0.40) was used as a target. Also, the first and second piezoelectric thin films 103 and 104 were deposited under the following conditions. In a deposition chamber provided with the target, the silicon substrate 101 having the first electrode film 102 on one face thereof was previously annealed to 580° C. and the substrate was kept at the temperature. A mixed gas of argon and oxygen (with a gas volume ratio of $Ar/O_2=79/1$) was used as a sputtering gas, and the gas pressure and the flow rate of the gas were set to 0.2 Pa and 40 ml/min., respectively. With plasma generating power set to be 3 kW, the first piezoelectric thin film 103 was deposited for 50 seconds. Thereafter, the deposition was once stopped, of the above-described deposition conditions, only the gas volume ratio of the sputtering gas was changed to $Ar/O_2=38/2$ and, without changing the other deposition conditions, the second piezoelectric thin film 104 was deposited for 2800 seconds.

As a result of the same analyses and observations as those carried out in Example 1, the Pd electrode used as the first electrode film 102 was found to be an aggregate of columnar grains (columnar crystal) with an average grain size (average diameter) of 20 nm. The first and second piezoelectric thin films 103 and 104 were present as aggregates of columnar grains mutually continuously linked. The first piezoelectric thin film 103 had a thickness of 100 nm, and the average grain size (average diameter) of its columnar grain was 70 nm. The second piezoelectric thin film 104 had a thickness of 3000 nm, and the average grain size (average diameter) of its columnar grain was 150 nm. The ratio of the thickness of the piezoelectric layered film 110 to the average grain size (average diameter) of the columnar grain of the second piezoelectric thin film 104 was 20.7.

Moreover, as a result of the analysis by X-ray diffraction, the first and second piezoelectric thin films 103 and 104 were found to have the perovskite type crystal structure. The (001) crystal orientation ratio on the deposited face of the first piezoelectric film 103 was 50%, and the (001) crystal orientation ratio on the deposited face of the second piezoelectric thin film 104 was 75%.

Furthermore, as a result of the composition analysis of cation using the X-ray microanalyzer, the composition ratios of Pb:Zr:Ti of the first piezoelectric thin film 103 and the second piezoelectric thin film 104 were found to be 1.05:0.60:0.40 and 1.10:0.60:0.40, respectively. That is, as in Example 1, each of the first and second piezoelectric thin films 103 and 104 was found to be a PZT film having the perovskite type crystal structure with the (001) axis grown preferentially oriented along the vertical direction to the top face of the substrate 101. It was also found that the composition ratios of Zr and Ti in the first and second piezoelectric thin films 103 and 104 were the same, but the composition ratio of Pb was smaller in the first piezoelectric thin film 103 than in the second piezoelectric thin film 104.

Moreover, as in Example 1, a triangle wave voltage of 0 V to −50 V was applied to between the first and second electrode films 2 and 5 through the leads 8 and 9 to measure the displacement amount of the tip of the piezoelectric element 20 along the Z-axis direction using a laser Doppler vibrometer. From a result of the measurement, it was found that the tip of the piezoelectric element 20 was displaced by 20.2 μm at most.

Moreover, after the piezoelectric element 20 was continuously driven by the triangle wave voltage for 120 hours in a high-temperature, high-humidity atmosphere (at a temperature of 50° C. and a humidity of 50%), a driving state of the piezoelectric element 20 was examined and also the appearance of the piezoelectric element 20 was examined using an optical microscope. As a result, even after the piezoelectric element 20 was continuously driven in a high-temperature, high-humidity atmosphere for 120 hours, the displacement amount was 20.2 μm at most, reduction in the displacement amount was not observed and also change in the color of the first electrode film 2 was not observed either.

EXAMPLE 4

In this example, a silicon substrate was used as the substrate 101 and a Ru thin film with a thickness of 110 nm was used as the first electrode film 102. The Ru film was deposited using a ternary rf-magnetron sputtering system. Specifically, the substrate 101 was previously annealed to 400° C. and was kept at the temperature. A mixed gas of argon and oxygen (with a gas volume ratio of $Ar/O_2=15/1$) was used as a sputtering gas and a total gas pressure was kept at 0.25 Pa. A target of Ru was used as a first target of the ternary rf magnetron sputtering system. Then, with high frequency power of 200 W applied to the first target, sputtering was performed for 1200 seconds, thereby depositing the Ru thin film.

The thickness of the piezoelectric layered film 110 was set to be 4505 nm. The piezoelectric layered film 110 was formed of a first piezoelectric thin film 103 made of PZT with the (001) preferred orientation and having a thickness of 5 nm and a second piezoelectric thin film 104 formed on the first piezoelectric film 103, made of PZT with the (001) preferred orientation, and having a thickness of 4500 nm.

The first and second piezoelectric thin films 103 and 104 were deposited using an rf-magnetron sputtering system (see FIG. 2B). At this point, a sintered body with a diameter of 6 inches of lead zirconate titanate (PZT) with a stoichiometric composition prepared by excessively adding approximately 20 mol % of PbO (having a composition molar ratio of Pb:Zr:Ti of 1.20:0.53:0.47) was used as a target. Also, the first and second piezoelectric thin films 103 and 104 were deposited under the following conditions. In a deposition chamber provided with the target, the silicon substrate 101 having the first electrode film 102 on one face thereof was previously annealed to 580° C. and the substrate was kept at the temperature. A mixed gas of argon and oxygen (with a gas volume ratio of $Ar/O_2=79/1$) was used as a sputtering gas, and the gas pressure and the flow rate were set to 0.2 Pa and 40 ml/min., respectively. With plasma generating power set to be 3 kW, the first piezoelectric thin film 103 was deposited for 10 seconds. Thereafter, the deposition was once stopped, of the above-described deposition conditions, only the gas volume ratio of the sputtering gas was changed to $Ar/O_2=38/2$ and, without changing the other deposition conditions, the second piezoelectric thin film 104 was deposited for 3600 seconds.

As a result of the same analyses and observations as those carried out in Example 1, the Ru electrode used as the first electrode film 102 was found to be an aggregate of columnar grains (columnar crystal) with an average grain size (average diameter) of 25 nm. The first and second piezoelectric thin films 103 and 104 were present as aggregates of columnar grains mutually continuously linked. The first piezoelectric thin film 103 had a thickness of 5 nm, and the average grain size (average diameter) of its columnar grain was 50 nm. The second piezoelectric thin film 104 had a thickness of 4500 nm, and the average grain size (average diameter) of its columnar grain was 150 nm. The ratio of the thickness of the piezoelectric layered film 110 to the average grain size (average diameter) of the columnar grain of the second piezoelectric film 104 was 30.

Moreover, as a result of the analysis by X-ray diffraction, the first and second piezoelectric thin films 103 and 104 were found to have the perovskite type crystal structure. The (001) crystal orientation ratio on the deposited face of the first piezoelectric film 103 was 60%, and the (001) crystal orientation ratio on the deposited face of the second piezoelectric film 104 was 85%.

Furthermore, as a result of the composition analysis of cation using the X-ray microanalyzer, the composition ratios of Pb:Zr:Ti of the first piezoelectric thin film 103 and the second piezoelectric thin film 104 were found to be 0.95:0.53:0.47 and 1.10:0.53:0.47, respectively. That is, each of the first and second piezoelectric thin films 103 and 104 was found to be a PZT film having the perovskite type crystal structure with the (001) axis grown preferentially oriented along the vertical direction to the top face of the substrate 101. It was also found that the composition ratios of Zr and Ti in the first and second piezoelectric thin films 103 and 104 were the same, but the composition ratio of Pb was smaller in the first piezoelectric thin film 103 than in the second piezoelectric thin film 104.

Moreover, as in Example 1, a triangle wave voltage of 0 V to −50 V was applied to between the first and second electrode films 2 and 5 through the leads 8 and 9 to measure the displacement amount of the tip of the piezoelectric element 20 along the Z-axis direction using a laser Doppler vibrometer. From a result of the measurement, it was found that the tip of the piezoelectric element 20 was displaced by 18.8 μm at most.

Moreover, after the piezoelectric element 20 was continuously driven by the triangle wave voltage for 120 hours in a high-temperature, high-humidity atmosphere (at a temperature of 50° C. and a humidity of 50%), a driving state of the piezoelectric element 20 was examined and also the appearance of the piezoelectric element 20 was examined using an optical microscope. As a result, even after the piezoelectric element 20 was continuously driven in a high-temperature, high-humidity atmosphere for 120 hours, the displacement amount was 18.8 μm at most, reduction in the displacement amount was not observed and also change in the color of the first electrode film 2 was not observed either.

EXAMPLE 5

In this example, a silicon substrate was used as the substrate 101 and an Ir—Co alloy thin film with a thickness of 130 nm was used as the first electrode film 102. The Ir—Co film was deposited using a ternary rf-magnetron sputtering system. Specifically, the silicon substrate 101 was previously annealed to 400° C. and was kept at the temperature. A mixed gas of argon and oxygen (with a gas volume ratio of $Ar/O_2=15/1$) was used as a sputtering gas and a total gas pressure was kept at 0.25 Pa. A target of Ir and a target of Co were used as first and second targets of the ternary rf-magnetron sputtering system, respectively. Then, with high frequency power of 200 W and 60 W applied to the first and second targets, respectively, sputtering was performed for 1200 seconds, thereby depositing the Ir—Co alloy thin film as the first electrode film 102.

The thickness of the piezoelectric layered film 110 was set to be 3030 nm. The piezoelectric layered film 110 was formed of a first piezoelectric thin film 103 made of PZT with the (001) preferred orientation and having a thickness of 30 m and a second piezoelectric thin film 104 formed on the first piezoelectric thin film 103, made of PZT with the (001) preferred orientation, and having a thickness of 3000 nm.

In this example, the first and second piezoelectric thin films 103 and 104 were deposited using a ternary rf-magnetron sputtering system (see FIG. 2B). At this point, a sintered body with a diameter of 6 inches of lead zirconate titanate (PZT) with a stoichiometric composition prepared by excessively adding approximately 20 mol % of PbO (having a composition molar ratio of Pb:Zr:Ti of 1.20:0.50:0.50) was used as a target. Also, the first and second piezoelectric thin films 103 and 104 were deposited under the following conditions. In a deposition chamber provided with the target, the substrate 101 having the first electrode film 102 on one face thereof was previously annealed to 580° C. and the substrate was kept at the temperature. A mixed gas of argon and oxygen (with a gas volume ratio of $Ar/O_2=79/1$) was used as a sputtering gas, and the gas pressure and the flow rate were set to be 0.2 Pa and 40 ml/min., respectively. With plasma generating power set to be 3 kW, the first piezoelectric thin film 103 was deposited for 30 seconds. Thereafter, the deposition was once stopped, of the above-described deposition conditions, only the gas volume ratio of the sputtering gas was changed to $Ar/O_2=38/2$ and, without changing the other deposition conditions, the second piezoelectric thin film 104 was deposited for 3000 seconds.

As a result of the same analyses and observations as those carried out in Example 1, the Ir—Co electrode used as the first electrode film 102 was found to be an Ir thin film containing Co at a composition of 4% and also an aggregate of columnar grains (columnar crystal) with an average grain size (average diameter) of 20 nm. The first and second piezoelectric thin films 103 and 104 were present as aggregates of columnar grains mutually continuously linked. The first piezoelectric thin film 103 had a thickness of 30 nm, and the average grain size (average diameter) of its columnar grain was 40 nm. The second piezoelectric thin film 104 had a thickness of 3000 nm, and the average grain size (average diameter) of its columnar grain was 60 nm. The ratio of the thickness of the piezoelectric layered film 110 to the average grain size (average diameter) of the columnar grain of the second piezoelectric film 104 was 50.5.

Moreover, as a result of the analysis by X-ray diffraction, each of the first and second piezoelectric thin films 103 and 104 was found to have the perovskite type crystal structure. The (001) crystal orientation ratio on the deposited face of the first piezoelectric film 103 was 65%, and the (001) crystal orientation ratio on the deposited face of the second piezoelectric film 104 was 80%.

Furthermore, as a result of the composition analysis of cation using the X-ray microanalyzer, the composition ratios of Pb:Zr:Ti of the first piezoelectric thin film 103 and the second piezoelectric thin film 104 were found to be 1.00:0.50:0.50 and 1.10:0.50:0.50, respectively. That is, each of the first and second piezoelectric thin films 103 and 104 was found to be a PZT film having the perovskite type crystal structure with the (001) axis grown preferentially oriented along the vertical direction to the top face of the substrate 101. It was also found that the composition ratios of Zr and Ti in the first and second piezoelectric thin films 103 and 104 were the same, but the composition ratio of Pb was smaller in the first piezoelectric thin film 103 than in the second piezoelectric thin film 104.

Moreover, as in Example 1, a triangle wave voltage of 0 V to −50 V was applied to between the first and second electrode films 2 and 5 through the leads 8 and 9 to measure the displacement amount of the tip of the piezoelectric element 20 along the Z-axis direction using a laser Doppler vibrometer. From a result of the measurement, it was found that the tip of the piezoelectric element 20 was displaced by 26.7 μm at most.

Moreover, after the piezoelectric element 20 was continuously driven by the triangle wave voltage for 120 hours in a high-temperature, high-humidity atmosphere (at a temperature of 50° C. and a humidity of 50%), a driving state of the piezoelectric element 20 was examined and also the appearance of the piezoelectric element 20 was examined using an optical microscope. As a result, even after the piezoelectric element 20 was continuously driven in a high-temperature, high-humidity atmosphere for 120 hours, the displacement amount was 26.7 μm at most, reduction in the displacement amount was not observed and also change in the color of the first electrode film 2 was not observed either.

COMPARATIVE EXAMPLE 1

For comparison with the piezoelectric element of each of the above-described examples, the following piezoelectric element was fabricated as Comparative Example 1. In this comparative example, unlike Example 1, the Pb composition of a first piezoelectric thin film was larger than that of a second piezoelectric thin film. Note that a piezoelectric layered film was deposited in the same manner as in Example 1 but deposition conditions were different from those in Example 1. Apart from these points, the piezoelectric element of Comparative Example 1 was totally the same as that of in Example 1.

As a result of the same analyses and observations as those carried out in Example 1, the first and second piezoelectric thin films of this comparative example were present as aggregates of columnar grains mutually continuously linked. The first piezoelectric thin film had a thickness of 100 nm and the average grain size (average diameter) of the columnar grain was 60 nm. The second piezoelectric thin film had a thickness of 3000 nm and the average grain size (average diameter) of the columnar grain was 180 nm. The ratio of the thickness of the piezoelectric layered film to the cross-sectional diameter of the columnar grain of the piezoelectric thin film was 17.2.

Furthermore, as a result of the analysis by X-ray diffraction, each of the first and second piezoelectric films was found to have the perovskite type crystal structure. The (001) crystal orientation ratio of the first piezoelectric film was 70%. The (001) crystal orientation ratio of the second piezoelectric film was 88%.

Also, as a result of the composition analysis of cation using the X-ray microanalyzer, the composition ratio of Pb:Zr:Ti of the first piezoelectric thin film was found to be 1.15:0.53:0.47 and the composition ratio of Pb:Zr:Ti of the second piezoelectric thin film was found to be 1.10:0.53:0.47. That is, each of the first and second piezoelectric thin films was found to be a PZT film having the perovskite type crystal structure with the (001) axis grown preferentially oriented along the vertical direction to the top face of a substrate. It was also found that the composition ratios of Zr and Ti in the first and second piezoelectric thin films were the same, but the composition ratio of Pb was larger in the first piezoelectric thin film than in the second piezoelectric thin film.

Moreover, it was found that when a triangle wave voltage of 0 V to −50 V was applied in the same manner as in Example 1, the tip of the piezoelectric element was displaced by 22.3 μm at most.

Moreover, after the piezoelectric element was continuously driven by the triangle wave voltage for 120 hours in a high-temperature, high-humidity atmosphere (at a temperature of 50° C. and a humidity of 50%), a driving state of the piezoelectric element was examined and also the appearance of the piezoelectric element was examined using an optical microscope. As a result, after the piezoelectric element was continuously driven in a high-temperature, high-humidity atmosphere for 120 hours, the displacement amount was reduced (0 μm) and the color of the first electrode film was turned black. That is, the piezoelectric element was deteriorated.

COMPARATIVE EXAMPLE 2

For comparison with the piezoelectric element of each of the above-described examples, the following piezoelectric element was fabricated as Comparative Example 2. In this comparative example, unlike Example 2, the Pb composition of a first piezoelectric thin film was larger than that of a second piezoelectric thin film. Note that a piezoelectric layered film was deposited in the same manner as in Example 2 but deposition conditions were different from those in Example 2. Apart from these points, the piezoelectric element of Comparative Example 2 was totally the same as that of in Example 2.

As a result of the same analyses and observations as those carried out in Example 1, the first and second piezoelectric thin films of this comparative example were present as aggregates of columnar grains mutually continuously linked. The first piezoelectric thin film had a thickness of 50 nm and the average grain size (average diameter) of the columnar grain was 70 nm. The second piezoelectric thin film had a thickness of 2500 nm and the average grain size (average diameter) of the columnar grain was 140 nm. The ratio of the thickness of the piezoelectric layered film to the cross-sectional diameter of the columnar grain of the second piezoelectric thin film was 18.2.

Furthermore, as a result of the analysis by X-ray diffraction, each of the first and second piezoelectric films was found to have the perovskite type crystal structure. The (001) crystal orientation ratio of the first piezoelectric film was 65%. The (001) crystal orientation ratio of the second piezoelectric film was 85%.

Also, as a result of the composition analysis of cation using the X-ray microanalyzer, the composition ratio of Pb:Zr:Ti of the first piezoelectric thin film was found to be 1.10:0.50:0.50 and the composition ratio of Pb:Zr:Ti of the second piezoelectric thin film was found to be 1.05:0.50:0.50. That is, each of the first and second piezoelectric thin films was found to be a PZT film having the perovskite type crystal structure with the (001) axis grown preferentially oriented along the vertical direction to the top face of a substrate. It was also found that the composition ratios of Zr and Ti in the first and second piezoelectric thin films were the same, but the composition ratio of Pb was larger in the first piezoelectric thin film than in the second piezoelectric thin film.

Moreover, it was found that when a triangle wave voltage of 0 V to −50 V was applied in the same manner as in Example 2, the tip of the piezoelectric element was displaced by 18.0 μm at most.

Moreover, after the piezoelectric element was continuously driven by the triangle wave voltage for 120 hours in a high-temperature, high-humidity atmosphere (at a temperature of 50° C. and a humidity of 50%), a driving state of the piezoelectric element was examined and also the appearance of the piezoelectric element was examined using an optical microscope. As a result, after the piezoelectric element was continuously driven in a high-temperature, high-humidity atmosphere for 120 hours, the displacement amount was reduced (0 μm) and the color of the first electrode film was turned black. That is, the piezoelectric element was deteriorated.

Effects

As has been described, according to this embodiment, the Pb composition of the first piezoelectric thin film 3 is smaller than that of the second piezoelectric thin film 4. Thus, even if the piezoelectric element 20 is driven in a high-temperature, high-humidity (at a temperature of 50° C. and a humidity of 50%), deterioration of the piezoelectric element 20 due to a reaction of the excessive Pb of the first piezoelectric thin film 3 with water at the interface between the first electrode film 2 and the first piezoelectric thin film 3 is not caused. Therefore, a piezoelectric element 20 with excellent piezoelectric properties and high moisture resistance can be achieved at low cost.

(Embodiment 2)

Figure 5:
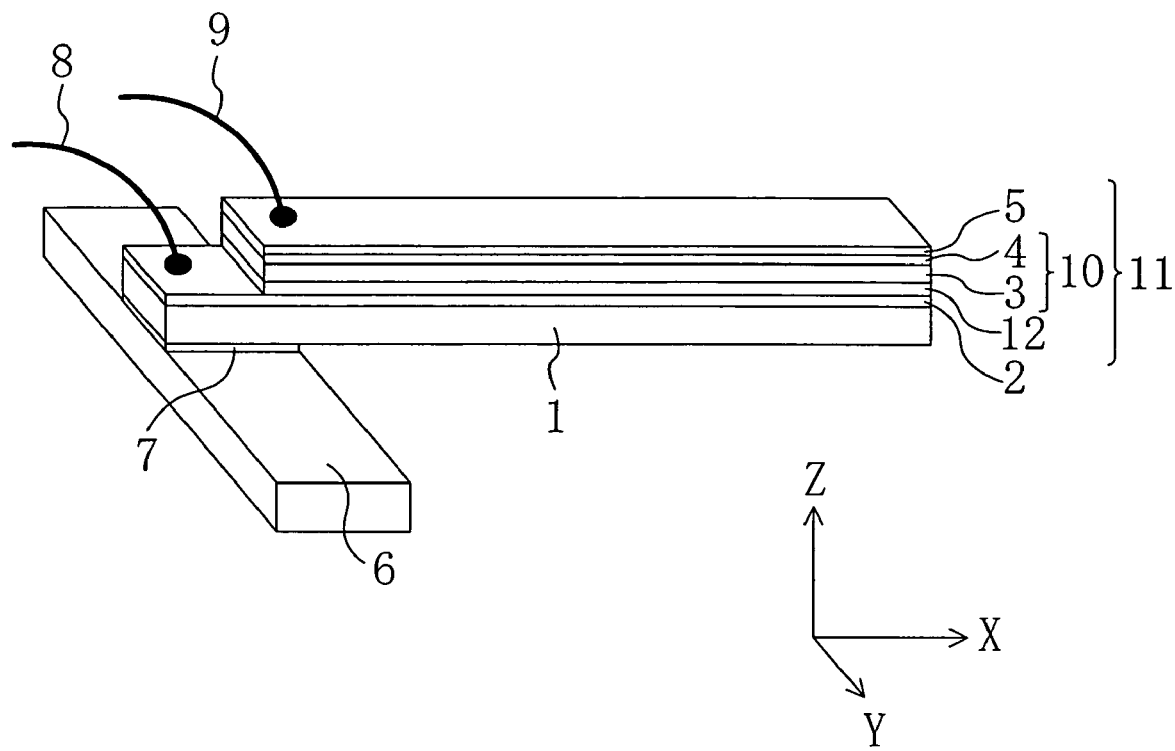
FIG. 5 is a perspective view of another piezoelectric element.

As shown in FIG. 5, a piezoelectric element 21 according to EMBODIMENT 2 of the present invention includes an orientation controlling film 12 provided between the first electrode film 2 and the first piezoelectric thin film 3. Apart from this point, the piezoelectric element 21 of this embodiment has substantially the same structure as that of the piezoelectric element 20 of EMBODIMENT 1.

The piezoelectric element 21 of this embodiment has a similar shape to that of the piezoelectric element 20 of EMBODIMENT 1 and includes a substrate 1 in the shape of a strip (with a thickness of 0.3 mm, a width of 3.0 mm and a length of 15.0 mm) and a layered body 11 formed on the substrate 1. The piezoelectric element 21 has a width of 3.0 mm. One end portion of the piezoelectric element 21 (that is, the left end portion in FIG. 5) is fixed onto a stainless steel supporting substrate 6 (with a thickness of 1.0 mm, a width of 3.0 mm and a length of 10.0 mm) with an epoxy resin adhesive 7 interposed therebetween. The end portion herein means a portion of the piezoelectric element 21 extending inwardly from one end of the piezoelectric element 21 (that is, the left end in FIG. 5) by a length of 3.0 mm. The longitudinal direction of the piezoelectric element 21 is substantially perpendicular to the longitudinal direction of the stainless steel supporting substrate 6. Thus, the piezoelectric element 21 is constructed as a cantilever.

The substrate 1 also works as a diaphragm film (diaphragm layer) for inhibiting expansion and contraction of the layered body 11 caused by the piezoelectric effect. The layered body 11 includes a first electrode film 2 formed on the substrate 1, an orientation controlling film 12 formed on the first electrode film 2, a piezoelectric layered film 10 formed on the orientation controlling film 12 and a second electrode film 5 formed on the piezoelectric layered film 10.

The first electrode film 2 is formed over one face of the substrate 1 corresponding to one end thereof along the thickness direction of the substrate 1. The orientation controlling film 12 is formed on the first electrode film 2 excluding a portion above the aforementioned end portion. Specifically, the orientation controlling film 12 has a width of 3.0 mm and a length of 12.0 mm. A piezoelectric layered film 10 is formed on the orientation controlling film 12. More specifically, the piezoelectric layered film 10 includes a first piezoelectric thin film 3 formed on the orientation controlling film 12 and a second piezoelectric thin film 4 formed on the first piezoelectric thin film 3. The first piezoelectric thin film 3 has a function as a crystal orientation controlling film for controlling the crystal orientation of the second piezoelectric thin film 4.

The second electrode film 5 is made of platinum with a thickness of 100 nm. The first and second electrode films 2 and 5 are connected to gold leads 8 and 9, respectively.

As a characteristic of the present invention, each of the first and second piezoelectric thin films 3 and 4 is an aggregate of columnar grains having a crystal growth direction unidirectionally along the thickness direction of the piezoelectric layered film 10 (the first and second piezoelectric thin films 3 and 4). The Pb content of the first piezoelectric thin film 3 is smaller than that of the second piezoelectric thin film 4. The ratio of the thickness of the piezoelectric layered film to the average cross-sectional diameter of the columnar grain of the second piezoelectric thin film 4 is not less than 20 and not more than 60. When the ratio of the thickness of the piezoelectric layered film 10 to the average cross-sectional diameter of the columnar grain of the second piezoelectric thin film 4 is smaller than 20, cracks are disadvantageously caused in the piezoelectric layered film 10 due to stress caused in deposition, and when the ratio exceeds 60, the responsibility is disadvantageously lowered because power consumed in driving is large. Either case is not preferable.

Also, the columnar grain of the first piezoelectric thin film 3 has an average cross-sectional diameter (grain size) of not less than 40 nm and not more than 70 nm and a length of not less than 5 nm and not more than 100 nm. The columnar grain of the second piezoelectric thin film 4 has an average cross-sectional diameter (grain size) of not less than 60 nm and not more than 200 nm and a length of not less than 2500 nm and not more than 5000 nm.

Also, for each of the first and second piezoelectric thin films 3 and 4, a chemical composition ratio of Pb:Zr:Ti is represented by $(1+a):b:(1-b)$. The value b is the same value, i.e., a value of not less than 0.50 and not more than 0.60 for the first and second piezoelectric thin films 3 and 4. The value a is not less than −0.05 and not more than 0.05 in the first piezoelectric thin film 3 and is not less than 0 and not more than 0.10 in the second piezoelectric thin film 4.

Moreover, the orientation controlling film 12 is made of lead lanthanum titanate.

Moreover, the first electrode film 2 is made of at least a noble metal selected from the group consisting of Pt, Ir, Pd and Ru, or an alloy of the noble metal and at least a metal selected from the group consisting of Ti, Co, Ni, Al, Fe, Mn, Cu, Mg, Ca, Sr and Ba or an oxide of the metal, and is an aggregate of columnar grains having an average cross-sectional diameter of not less than 20 nm and not more than 30 nm.

At this point, when a voltage is applied to the piezoelectric element 21 through the leads 8 and 9 as in EMBODIMENT 1, the tip of the piezoelectric element 21 is displaced in the −Z direction along the Z-axis. Accordingly, when voltage application is repeated at constant periods, the tip of the piezoelectric element 21 is displaced along the Z-axis direction with a predetermined displacement amount. As a result, the displacement property of the piezoelectric element 21 can be evaluated.

Method for Fabricating Piezoelectric Element

Figure 6A:
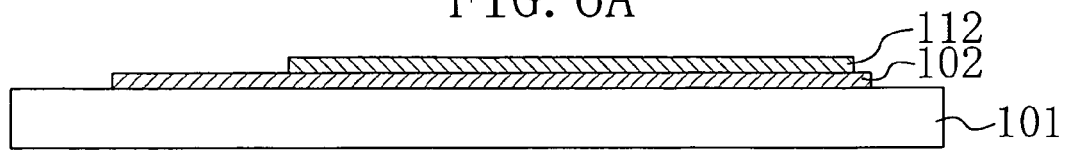
FIGS. 6A, 6B, 6C, 6D and 6E are cross-sectional views illustrating respective steps for fabricating the piezoelectric element.

Now, a method for fabricating a piezoelectric element 21 will be described with reference to FIGS. 6A through 6E. First, as shown in FIG. 6A, on a substrate 101 with a length of 20 mm, a width of 20 mm and a thickness of 0.3 mm, a first electrode film 102 is deposited by rf-magnetron sputtering using a stainless steel mask (with a thickness of 0.2 mm) having a rectangular opening with a width of 5.0 mm and a length of 18.0 mm.

Next, rf-magnetron sputtering is performed using a stainless steel mask (with a thickness of 0.2 mm) having a rectangular opening with a width of 5.0 mm and a length of 12.0 mm and also using a sintered body of lead lanthanum titanate used as a target under first deposition conditions, thereby depositing an orientation controlling film 112 on the first electrode film 102.

Next, a piezoelectric layered film 110 is accurately deposited on the orientation controlling film 112 by rf-magnetron sputtering using the same mask. Specifically, the piezoelectric layered film 110 is deposited as follows. First, rf-magnetron sputtering is performed using a sintered body of a PZT oxide as a target under second deposition conditions which are different from the first deposition conditions for depositing a first piezoelectric thin film 103 on the orientation controlling film 112. Then, a second piezoelectric thin film 104 is continuously deposited on the first piezoelectric thin film 103 by rf-magnetron sputtering performed using the same target as that used in forming the first piezoelectric thin film 103 under different deposition conditions from the second deposition conditions employed for forming the first piezoelectric thin film 103.

Figure 6B:
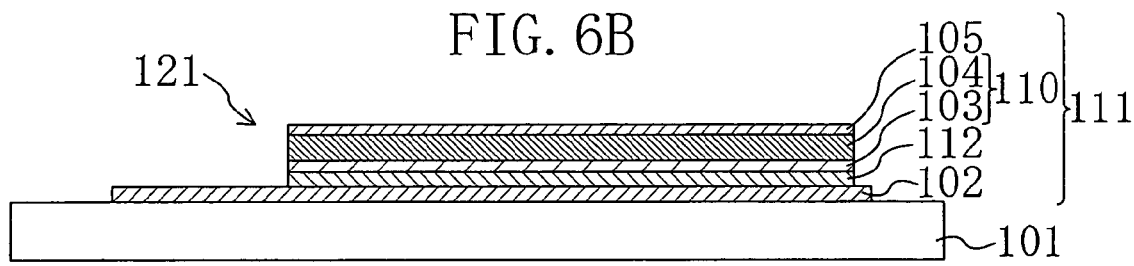

Next, a second electrode film 105 is accurately deposited on the piezoelectric layered film 110 by the rf-magnetron sputtering using the same mask. As a result, as shown in FIG. 6B, a structure 121 including the substrate 101 and a layered body 111 formed on the substrate 101 and including the piezoelectric layered film 110 can be obtained.

Figure 6C:
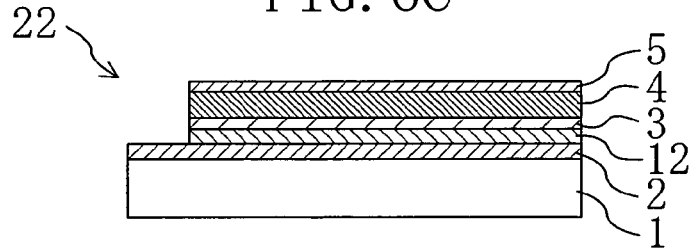

Next, as shown in FIG. 6C, the structure 121 is cut with a dicing saw so that the substrate 1 has a strip shape with a width of 3.0 mm and a length of 15.0 mm and a portion a first electrode film 2 extending from one end (i.e., the left end in FIG. 6C) thereof by a length of 3.0 mm is exposed. As a result, a piezoelectric element structure component 22 in which the substrate 1, the first electrode film 2, an orientation controlling film 12, a first piezoelectric thin film 3, a second piezoelectric thin film 4 and a second electrode film 5 are stacked in this order can be obtained.

Figure 6D:
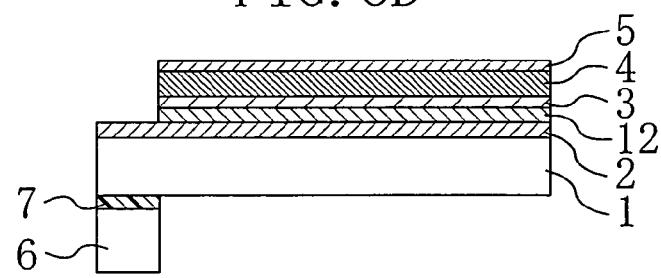

Then, as shown in FIG. 6D, a portion (i.e., the left end portion in FIG. 6D) of the substrate 1 corresponding to the exposed portion of the first electrode film 2 is jointed on a stainless steel supporting substrate 6 with an epoxy resin adhesive 7.

Figure 6E:
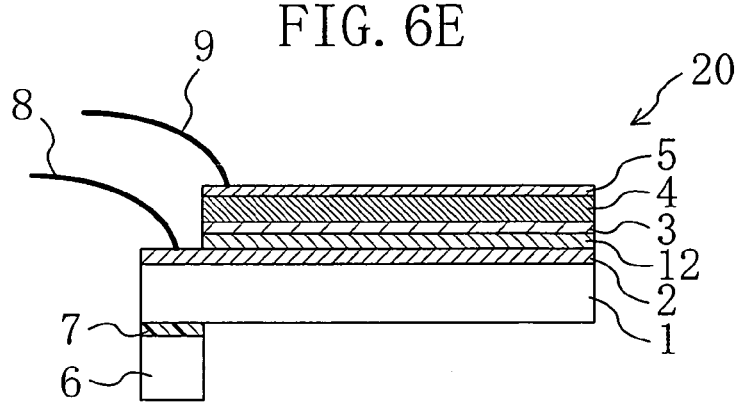
Figure 7:
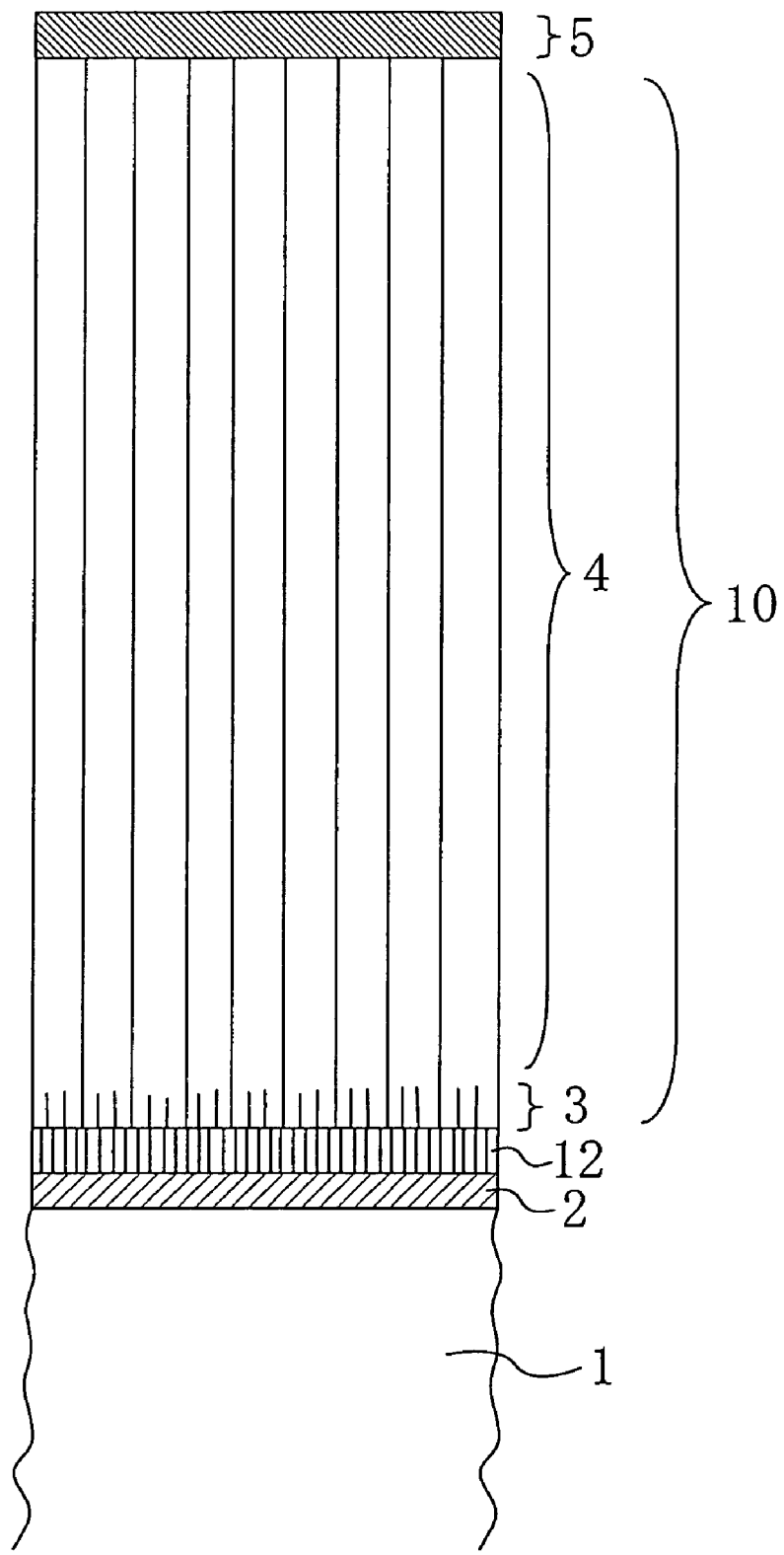
FIG. 7 is a view illustrating the film structure of the piezoelectric element.

Next, as shown in FIG. 6E, a lead 8 is connected to the exposed portion of the first electrode 2 with a conductive adhesive (conductive paste containing silver), and a lead 9 is connected to a portion of the second electrode film 5 located closer to the exposed portion of the first electrode film 2 by wire bonding. Thus, the piezoelectric element 21 shown in FIG. 5 can be obtained. FIG. 7 is a view illustrating the film structure of the piezoelectric element 21.

Now, specifically practiced examples will be described.

EXAMPLE 6

In this example, a silicon substrate was used as the substrate 101 and a Pt thin film with a thickness of 100 nm was used as the first electrode film 102. The substrate 101 and the first electrode film 102 were prepared totally in the same manner as in Example 1.

The orientation controlling film 112 was deposited for 12 minutes, using as a target a sintered body prepared by excessively adding 15 mol % of lead oxide (PbO) to PLT containing 10 mol % of lanthanum, with a substrate temperature of 600° C., in a mixed gas atmosphere of argon and oxygen (with a gas volume ratio of $Ar/O_2=19/1$), at a vacuum level of 0.8 Pa and with high frequency power of 300 W applied.

The piezoelectric layered film 110 was deposited using the rf-magnetron sputtering system of Example 1. At this point, a sintered body with a diameter of 6 inches of lead zirconate titanate (PZT) with a stoichiometric composition (having a composition molar ratio of Pb:Zr:Ti of 1.20:0.53: 0.47) was used as a target. Also, the piezoelectric layered film 110 was deposited under the following conditions. In a deposition chamber provided with the target, the silicon substrate 101 having the first electrode film 102 on one face thereof was previously annealed to 580° C. and the substrate was kept at the temperature. A mixed gas of argon and oxygen (with a gas volume ratio of $Ar/O_2=79/1$) was used as a sputtering gas, and the gas pressure and the flow rate of the gas were set to be 0.2 Pa and 40 ml/min., respectively. With plasma generating power set to be 3 kW, the first piezoelectric thin film 103 was deposited for 50 seconds. Thereafter, the deposition was once stopped, of the above-described deposition conditions, only the gas volume ratio of the sputtering gas was changed to $Ar/O_2=38/2$ and, without changing the other deposition conditions, the second piezoelectric thin film 104 was deposited for 2500 seconds.

Compositions, film thicknesses, cross-sectional structures and crystal orientations of the first electrode film 102, the orientation controlling film 112 and the piezoelectric layered film 110 were examined in the same manner as in Example 1.

As a result, the Pt electrode used as the first electrode film 102 was found to be an aggregate of columnar grains with an average grain size (average diameter) of 20 nm.

The orientation controlling film 112 was found to have the perovskite type crystal structure containing 10 mol % of lanthanum and containing lead at an amount exceeding a stoichiometric composition by 10%.

The first piezoelectric thin film 103 had a thickness of 100 nm, and the average grain size (average diameter) of its columnar grain was 40 nm. The second piezoelectric thin film 104 had a thickness of 2800 nm, and the average grain size (average diameter) of its columnar grain was 100 nm. The ratio of the thickness of the piezoelectric layered film 110 to the average grain size (average diameter) of the columnar grain of the second piezoelectric thin film 104 was 29.

Furthermore, as a result of the analysis by X-ray diffraction, each of the first and second piezoelectric films 103 and 104 was found to have the perovskite type crystal structure. The (001) crystal orientation ratio of deposition face of the first piezoelectric film 103 was 78% and the (001) crystal orientation ratio of deposition face of the second piezoelectric film 104 was 95%.

Furthermore, as a result of the composition analysis of cation by the X-ray microanalyzer, the composition ratios of Pb:Zr:Ti of the first piezoelectric thin film 103 and the second piezoelectric thin film 104 were found to be 1.00: 0.53:0.47 and 1.05:0.53:0.47, respectively. That is, each of the first and second piezoelectric thin films 103 and 104 was found to be a PZT film having the perovskite type crystal structure with the (001) axis grown preferentially oriented along the vertical direction to the top face of the substrate 101. It was also found that the composition ratios of Zr and Ti in the first and second piezoelectric thin films 103 and 104 were the same, but the composition ratio of Pb was smaller in the first piezoelectric thin film 103 than in the second piezoelectric thin film 104.

Moreover, the displacement amount along the Z-axis direction of the tip of the piezoelectric element 21 was measured using the same evaluation apparatus as that used in Example 1. Specifically, a triangle wave voltage of 0 V to −50 V was applied to between the first and second electrode films 2 and 5 through the leads 8 and 9 to measure the displacement amount of the tip of the piezoelectric element 21 along the Z-axis direction using a laser Doppler vibrometer. From a result of the measurement, it was found that the tip of the piezoelectric element 21 was displaced by 28.3 μm at most.

Moreover, after the piezoelectric element 21 was continuously driven by the triangle wave voltage for 120 hours in a high-temperature, high-humidity atmosphere (at a temperature of 50° C. and a humidity of 50%), a driving state of the piezoelectric element 21 was examined and also the appearance of the piezoelectric element 21 was examined using an optical microscope. As a result, even after the piezoelectric element 21 was continuously driven in a high-temperature, high-humidity atmosphere for 120 hours, the displacement amount was 28.3 μm at most, reduction in the displacement amount was not observed and also change in the color of the first electrode film 2 was not observed either.

EXAMPLE 7

In this example, a silicon substrate was used as the substrate 101 and an Ir—Ti alloy thin film with a thickness of 120 nm was used as the first electrode film 102. The substrate 101 and the first electrode film 102 were prepared totally in the same manner as in Example 2.

The orientation controlling film 112 was deposited under the same deposition conditions using the same target as those employed in Example 6.

The piezoelectric layered film 110 was deposited using the rf-magnetron sputtering system of Example 1. At this point, a sintered body with a diameter of 6 inches of lead zirconate titanate (PZT) with a stoichiometric composition (having a composition molar ratio of Pb:Zr:Ti of 1.20:0.50: 0.50) was used as a target. Also, the piezoelectric layered film 110 was deposited under the following conditions. In a deposition chamber provided with the target, the silicon substrate 101 having the first electrode film 102 on one face thereof was previously annealed to 580° C. and the substrate was kept at the temperature. A mixed gas of argon and oxygen (with a gas volume ratio of Ar/O$_2$=79/1) was used as a sputtering gas, and the gas pressure and the flow rate of the gas were set to be 0.2 Pa and 40 ml/min., respectively. With plasma generating power set to be 3 kW, the first piezoelectric thin film 103 was deposited for 50 seconds. Thereafter, the deposition was once stopped, of the above-described deposition conditions, only the gas volume ratio of the sputtering gas was changed to Ar/O$_2$=38/2 and, without changing the other deposition conditions, the second piezoelectric thin film 104 was deposited for 3000 seconds.

Compositions, film thicknesses, cross-sectional structures and crystal orientations of the first electrode film 102, the orientation controlling film 112 and the piezoelectric layered film 110 were examined in the same manner as in Example 1.

As a result, the Ir—Ti alloy electrode used as the first electrode film 102 was found to be an Ir film containing 3% of titanium and an aggregate of columnar grains with an average grain size (average diameter) of 30 nm.

The orientation controlling film 112 was found to have the perovskite type crystal structure containing 10 mol % of lanthanum and containing lead at an amount exceeding a stoichiometric composition by 10%.

The first piezoelectric thin film 103 had a thickness of 100 nm, and the average grain size (average diameter) of its columnar grain was 40 nm. The second piezoelectric thin film 104 had a thickness of 3800 nm, and the average grain size (average diameter) of its columnar grain was 170 nm. The ratio of the thickness of the piezoelectric layered film 110 to the average grain size (average diameter) of the columnar grain of the second piezoelectric thin film 104 was 22.9.

Furthermore, as a result of the analysis by X-ray diffraction, each of the first and second piezoelectric films 103 and 104 was found to have the perovskite type crystal structure. The (001) crystal orientation ratio of deposition face of the first piezoelectric film 103 was 80% and the (001) crystal orientation ratio of deposition face of the second piezoelectric film 104 was 98%.

Furthermore, as a result of the composition analysis of cation by the X-ray microanalyzer, the composition ratios of Pb:Zr:Ti of the first piezoelectric thin film 103 and the second piezoelectric thin film 104 were found to be 1.05: 0.50:0.50 and 1.10:0.50:0.50, respectively. That is, each of the first and second piezoelectric thin films 103 and 104 was found to be a PZT film having the perovskite type crystal structure with the (001) axis grown preferentially oriented along the vertical direction to the top face of the substrate 101. It was also found that the composition ratios of Zr and Ti in the first and second piezoelectric thin films 103 and 104 were the same, but the composition ratio of Pb was smaller in the first piezoelectric thin film 103 than in the second piezoelectric thin film 104.

Moreover, the displacement amount along the Z-axis direction of the tip of the piezoelectric element 21 was measured using the same evaluation apparatus as that used in Example 1. Specifically, a triangle wave voltage of 0 V to −50 V was applied to between the first and second electrode films 2 and 5 through the leads 8 and 9 to measure the displacement amount of the tip of the piezoelectric element 21 along the Z-axis direction using a laser Doppler vibrometer. From a result of the measurement, it was found that the tip of the piezoelectric element 21 was displaced by 26.5 μm at most.

Moreover, after the piezoelectric element 21 was continuously driven by the triangle wave voltage for 120 hours in a high-temperature, high-humidity atmosphere (at a temperature of 50° C. and a humidity of 50%), a driving state of the piezoelectric element 21 was examined and also the appearance of the piezoelectric element 21 was examined using an optical microscope. As a result, even after the piezoelectric element 21 was continuously driven in a high-temperature, high-humidity atmosphere for 120 hours, the displacement amount was 26.5 μm at most, reduction in the displacement amount was not observed and also change in the color of the first electrode film 2 was not observed either.

EXAMPLE 8

In this example, a silicon substrate was used as the substrate 101 and a Ru thin film with a thickness of 110 nm was used as the first electrode film 102. The substrate 101 and the first electrode film 102 were prepared totally in the same manner as in Example 2.

The orientation controlling film 112 was deposited under the same deposition conditions using the same target as those employed in Example 6.

The piezoelectric layered film 110 was deposited using the rf-magnetron sputtering system of Example 1. At this point, a sintered body with a diameter of 6 inches of lead zirconate titanate (PZT) with a stoichiometric composition (having a composition molar ratio of Pb:Zr:Ti of 1.20:0.53: 0.47) was used as a target. Also, the piezoelectric layered film 110 was deposited under the following conditions. In a deposition chamber provided with the target, the silicon substrate 101 having the first electrode film 102 on one face thereof was previously annealed to 580° C. and the substrate was kept at the temperature. A mixed gas of argon and oxygen (with a gas volume ratio of $Ar/O_2=79/1$) was used as a sputtering gas, and the gas pressure and the flow rate of the gas were set to be 0.2 Pa and 40 ml/min., respectively. With plasma generating power set to be 3 kW, the first piezoelectric thin film 103 was deposited for 30 seconds. Thereafter, the deposition was once stopped, of the above-described deposition conditions, only the gas volume ratio of the sputtering gas was changed to $Ar/O_2=38/2$ and, without changing the other deposition conditions, the second piezoelectric thin film 104 was deposited for 3500 seconds.

Compositions, film thicknesses, cross-sectional structures and crystal orientations of the first electrode film 102, the orientation controlling film 112 and the piezoelectric layered film 110 were examined in the same manner as in Example 1.

As a result, the Ru electrode used as the first electrode film 102 was found to be an aggregate of columnar grains with an average grain size (average diameter) of 20 nm.

The orientation controlling film 112 was found to have the perovskite type crystal structure containing 10 mol % of lanthanum and containing lead at an amount exceeding a stoichiometric composition by 10%.

The first piezoelectric thin film 103 had a thickness of 50 nm, and the average grain size (average diameter) of its columnar grain was 50 nm. The second piezoelectric thin film 104 had a thickness of 3500 nm, and the average grain size (average diameter) of its columnar grain was 150 nm. The ratio of the thickness of the piezoelectric layered film 110 to the average grain size (average diameter) of the columnar grain of the second piezoelectric thin film 104 was 28.

Furthermore, as a result of the analysis by X-ray diffraction, each of the first and second piezoelectric films 103 and 104 was found to have the perovskite type crystal structure. The (001) crystal orientation ratio of deposition face of the first piezoelectric film 103 was 75% and the (001) crystal orientation ratio of deposition face of the second piezoelectric film 104 was 93%.

Furthermore, as a result of the composition analysis of cation by the X-ray microanalyzer, the composition ratios of Pb:Zr:Ti of the first piezoelectric thin film 103 and the second piezoelectric thin film 104 were found to be 1.00: 0.53:0.47 and 1.10:0.53:0.47, respectively. It was also found that the composition ratios of Zr and Ti in the first and second piezoelectric thin films 103 and 104 were the same, but the composition ratio of Pb was smaller in the first piezoelectric thin film 103 than in the second piezoelectric thin film 104.

Moreover, the displacement amount along the Z-axis direction of the tip of the piezoelectric element 20 was measured using the same evaluation apparatus as that used in Example 1. Specifically, a triangle wave voltage of 0 V to −50 V was applied to between the first and second electrode films 2 and 5 through the leads 8 and 9 to measure the displacement amount of the tip of the piezoelectric element 21 along the Z-axis direction using a laser Doppler vibrometer. From a result of the measurement, it was found that the tip of the piezoelectric element 21 was displaced by 29.7 μm at most.

Moreover, after the piezoelectric element 21 was continuously driven by the triangle wave voltage for 120 hours in a high-temperature, high-humidity atmosphere (at a temperature of 50° C. and a humidity of 50%), a driving state of the piezoelectric element 21 was examined and also the appearance of the piezoelectric element 21 was examined using an optical microscope. As a result, even after the piezoelectric element 21 was continuously driven in a high-temperature, high-humidity atmosphere for 120 hours, the displacement amount was 29.7 μm at most, reduction in the displacement amount was not observed and also change in the color of the first electrode film 2 was not observed either.

COMPARATIVE EXAMPLE 3

For comparison with the piezoelectric element of each of the above-described examples, the following piezoelectric element was fabricated as Comparative Example 3. In this comparative example, unlike Example 6, the Pb composition of a first piezoelectric thin film was larger than that of a second piezoelectric thin film. Note that a piezoelectric layered film was deposited in the same manner as in Example 6 but deposition conditions were different from those in Example 6. Apart from these points, the piezoelectric element of Comparative Example 3 was totally the same as that of in Example 6.

Compositions, film thicknesses, cross-sectional structures and crystal orientations of a first electrode film, an orientation controlling film and a piezoelectric layered film were examined in the same manner as in Example 1.

The orientation controlling film was found to have the perovskite type crystal structure containing 10 mol % of lanthanum and containing lead at an amount exceeding a stoichiometric composition by 10%.

The first piezoelectric thin film had a thickness of 100 nm, and the average grain size (average diameter) of its columnar grain was 70 nm. The second piezoelectric thin film had a thickness of 2800 nm, and the average grain size (average diameter) of its columnar grain was 180 nm. The ratio of the thickness of the piezoelectric layered film to the average grain size (average diameter) of the columnar grain of the second piezoelectric thin film was 16.1.

Furthermore, as a result of the analysis by X-ray diffraction, each of the first and second piezoelectric films was found to have the perovskite type crystal structure. The (001) crystal orientation ratio of deposition face of the first piezoelectric film was 80% and the (001) crystal orientation ratio of deposition face of the second piezoelectric film was 98%.

Furthermore, as a result of the composition analysis of cation by the X-ray microanalyzer, the composition ratios of Pb:Zr:Ti of the first piezoelectric thin film and the second piezoelectric thin film were found to be 1.15:0.53:0.47 and 1.10:0.53:0.47, respectively. That is, each of the first and second piezoelectric thin films was found to be a PZT film having the perovskite type crystal structure with the (001) axis grown preferentially oriented along the vertical direction to the top face of a substrate. It was also found that the composition ratios of Zr and Ti in the first and second piezoelectric thin films were the same, but the composition ratio of Pb was larger in the first piezoelectric thin film than in the second piezoelectric thin film.

Moreover, a driving endurance test for piezoelectric displacement of the piezoelectric element was performed using the same evaluation apparatus as that used in Example 1. Specifically, a triangle wave voltage of 0 V to −50 V was applied to between the first and second electrode films through the leads to measure the displacement amount of the tip of the piezoelectric element along the Z-axis direction using a laser Doppler vibrometer. From a result of the measurement, it was found that the tip of the piezoelectric element was displaced by 26.0 µm at most.

Moreover, after the piezoelectric element was continuously driven by the triangle wave voltage for 120 hours in a high-temperature, high-humidity atmosphere (at a temperature of 50° C. and a humidity of 50%), a driving state of the piezoelectric element was examined and also the appearance of the piezoelectric element was examined using an optical microscope. As a result, after the piezoelectric element was continuously driven in a high-temperature, high-humidity atmosphere for 120 hours, the displacement amount was reduced (0 µm) and the color of the first electrode film was turned black. That is, the piezoelectric element was deteriorated.

Effects

As has been described, according to this embodiment, the Pb composition of the first piezoelectric thin film 3 is smaller than that of the second piezoelectric thin film 4. Thus, even if the piezoelectric element 21 is driven in a high-temperature, high-humidity (at a temperature of 50° C. and a humidity of 50%), deterioration of the piezoelectric element 21 due to a reaction of the excessive Pb of the first piezoelectric thin film 3 with water which has been transmitted through the first electrode film 2 and the orientation controlling film 3 and has entered therein at the interface between the orientation controlling film 12 and the first piezoelectric thin film 3 is not caused. Therefore, a piezoelectric element 21 with excellent piezoelectric properties and high moisture resistance can be achieved at low cost.

Moreover, with the orientation controlling film 12 provided between the first electrode film 2 and the first piezoelectric thin film 3, the crystal orientation of the first piezoelectric thin film 3 is improved and furthermore the crystal orientation of the second piezoelectric thin film 4 is improved. Therefore, a piezoelectric element 21 with more excellent piezoelectric properties can be achieved.

(Embodiment 3)

Figure 8:
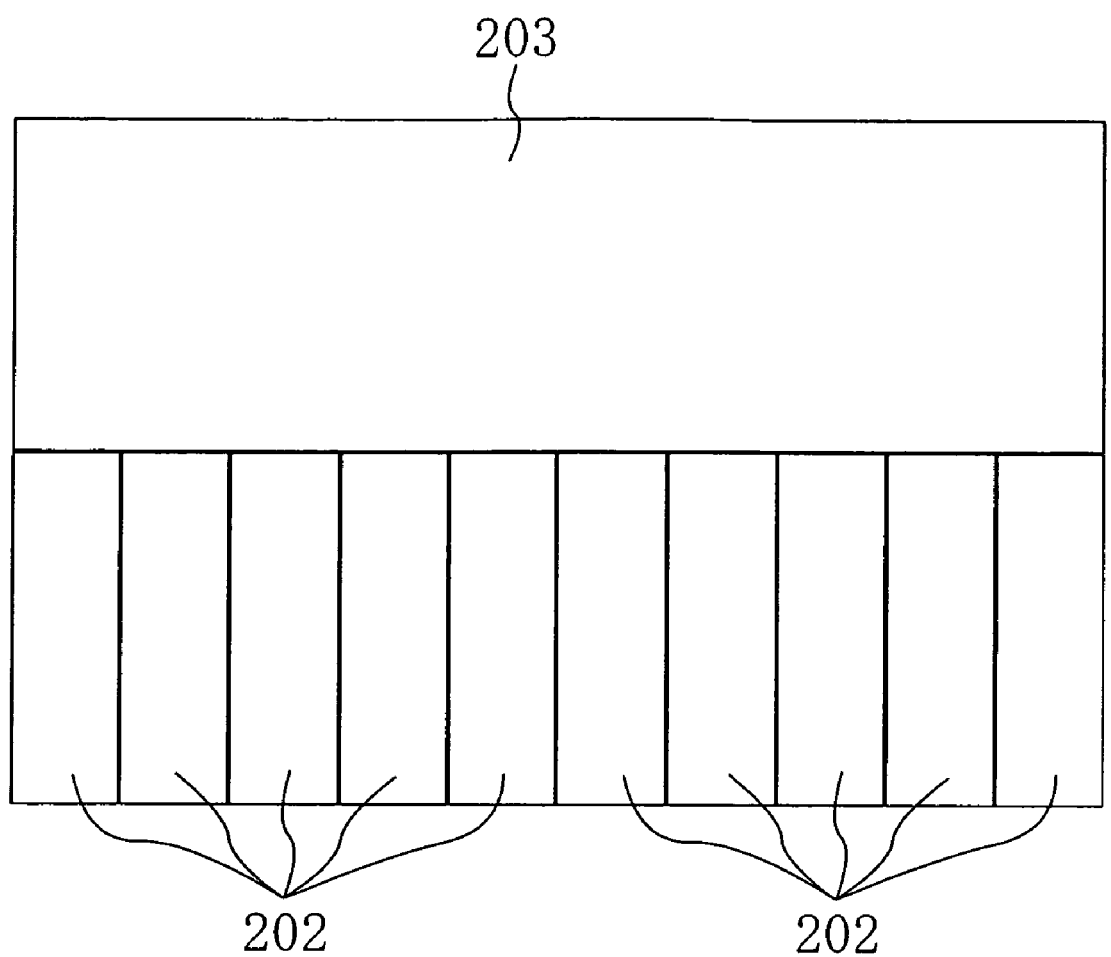
FIG. 8 is a view schematically illustrating the structure of an inkjet head.

In this embodiment, a piezoelectric element according to the present invention is applied to an inkjet head. As shown in FIG. 8, an inkjet head 201 of this embodiment includes ten ink discharging devices 202 arranged so as to be brought into line with one another and having the same shape and a driving power device 203 which is connected to each of respective individual electrodes 33 (see FIG. 9) of the ink discharging devices 202 and is for driving the ink discharging devices 202.

Figure 9:
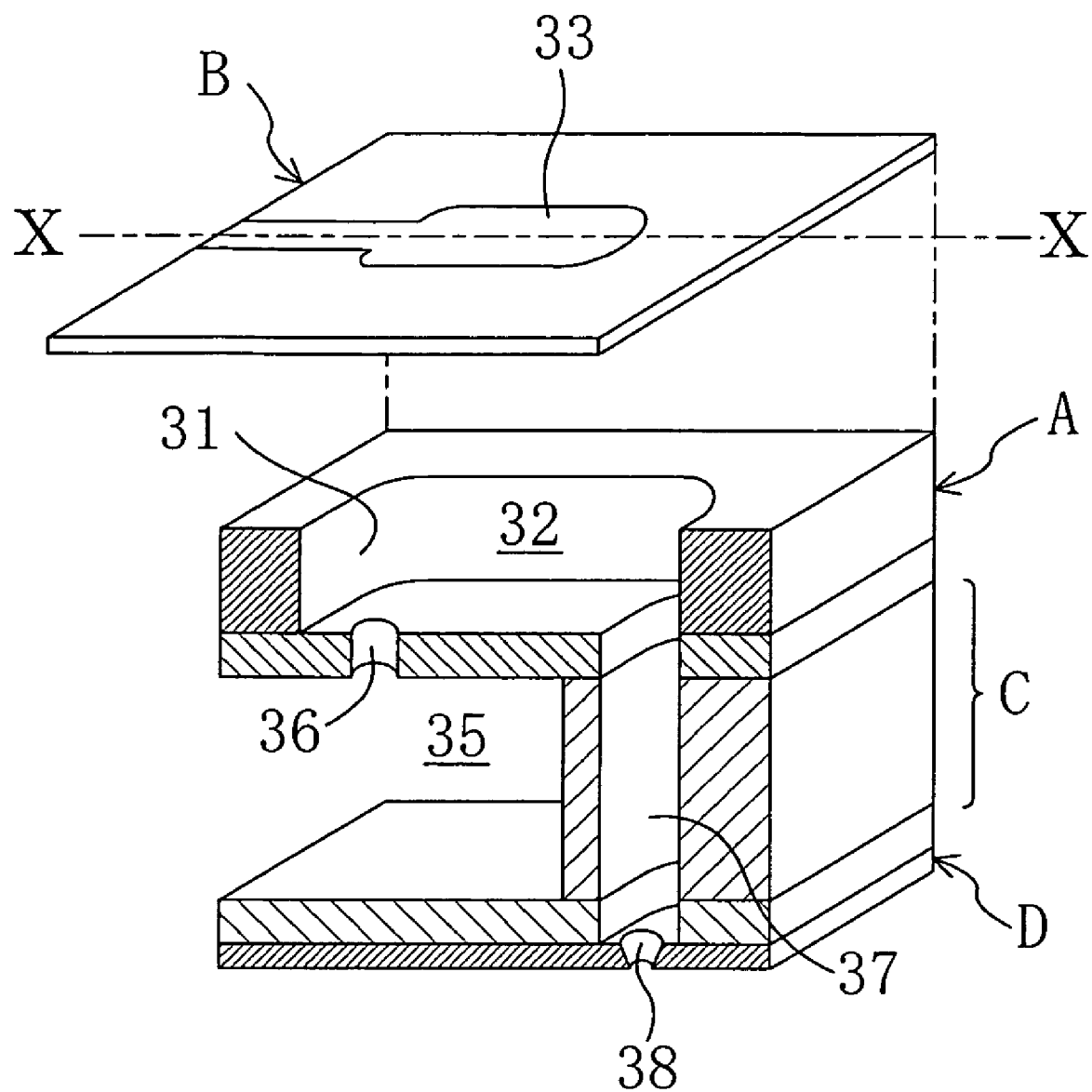
FIG. 9 is an exploded perspective view illustrating part of an ink discharging device cut out.

As shown in FIG. 9, each of the ink discharging devices 202 includes a nozzle plate D, an ink passage component C, a pressure chamber component A and an actuator component B stacked in this order. The pressure chamber component A, the actuator component B, the ink passage component C and the nozzle plate D are fixedly adhered to one another with an adhesive.

The pressure chamber component A has a pressure chamber opening 31. The actuator component B is provided so as to cover the pressure chamber opening 31 from the upper end side. Specifically, the actuator component B is provided so that part of a face thereof extending along the thickness direction faces the pressure chamber opening 31. The ink passage component C is provided so as to cover the pressure chamber opening 31 from the lower end side. Specifically, the pressure chamber opening 31 is partitioned by the actuator component B and the ink passage component C provided on and under the pressure chamber component A, respectively, and each of partitioned spaces forms a pressure chamber 32 (with a thickness of 0.2 mm) for containing ink. The shape of the pressure chamber opening 31 at the upper end is an elliptical shape with a minor axis of 200 µm and a major axis of 400 µm.

The ink passage component C has a common ink chamber 35 shared by a plurality of pressure chambers 32 arranged so as to be brought into line with one another, a supply port 36 for communicating the common ink chamber 35 with each pressure chamber 32, and an ink passage 37 for communicating each pressure chamber 32 with a nozzle hole 38 described later. The nozzle plate D has the nozzle hole 38 with a diameter of 30 µm.

The driving power device 203 supplies, through a bonding wire, a voltage to each of the respective individual electrodes 33 of the ink discharging devices 202. Note that a head body of the present invention corresponds to a combination of the nozzle plate D, the ink passage component C and the pressure chamber component A.

Now, specifically practiced examples will be described.

EXAMPLE 9

Figure 10:
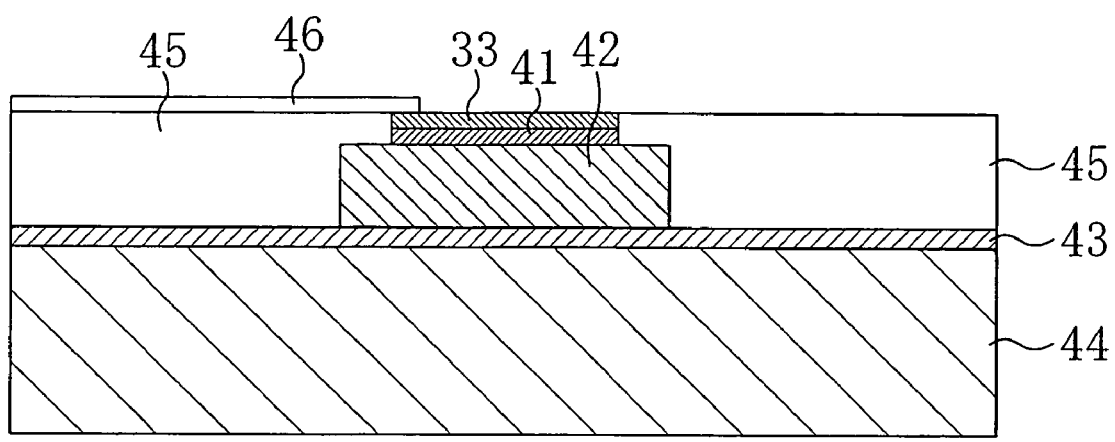
FIG. 10 is a cross-sectional view taken along the line X—X of FIG. 9.

FIG. 10 is a cross-sectional view taken along the line X—X of FIG. 9. The actuator component B includes an individual electrode 33 made of a Pt film and having a thickness of 100 nm, a first piezoelectric film 41 provided directly under the individual electrode 33, made of PZT represented by $Pb_{1.00}Zr_{0.53}Ti_{0.47}$ and having a thickness of 100 nm, a second piezoelectric film 42 provided directly under the first piezoelectric film 41, made of PZT represented by $Pb_{1.05}Zr_{0.53}Ti_{0.47}$ and having a thickness of 2800 nm, a second electrode film (common electrode) 43 provided directly under the second piezoelectric film 42, made of Pt and having a thickness of 100 nm, and a diaphragm film 44 provided directly under the second electrode film 43, made of chromium and having a thickness of 3500 nm. The individual electrode 33 is individually provided so as to correspond to the position of each pressure chamber 32. The diaphragm film 44 is displaced to vibrate owing to the piezoelectric effect obtained by the piezoelectric films 41 and 42. The second electrode film 43 and the diaphragm film 44 are shared by the ink discharging devices 202. On the second electrode film 43, an electric insulating organic film 45 of polyimide resin is formed up to the same height as the top face of the individual electrode 33 in a portion other than a layered film (which will be described later). A lead 46 made of gold, having a thickness of 100 nm and connected to the individual electrode 33 is formed on the top face of the electric insulating organic film 45. Note that the diaphragm film and the piezoelectric element of the present invention correspond to the actuator component B.

Method for Forming Ink Discharging Device

Hereinafter, a method for forming an ink discharging device 202 will be described with reference to FIGS. 11A through 11E and 12A through 12D. First, in the same manner as in Example 1, a first electrode film 52, a first piezoelectric thin film 53, a second piezoelectric thin film 54 and a second electrode film 43 are stacked in this order on a silicon substrate 51 with a length of 20 mm, a width of 20 mm and a thickness of 0.3 mm. Thus, a structure 55 shown in FIG. 11A can be obtained.

Figure 11A:
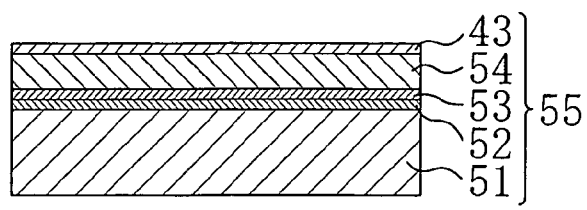
FIGS. 11A, 11B, 11C, 11D and 11E are cross-sectional views illustrating part of respective steps for fabricating an actuator component.
Figure 11B:
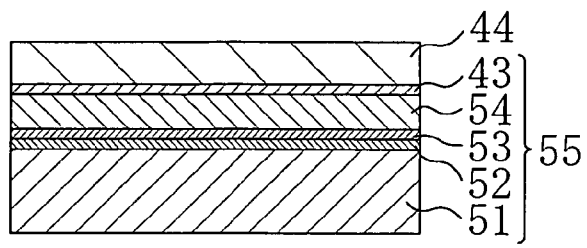

Next, as shown in FIG. 11B, a diaphragm film 44 is deposited on the second electrode film 43 by the rf-magnetron sputtering at room temperature.

Figure 11C:
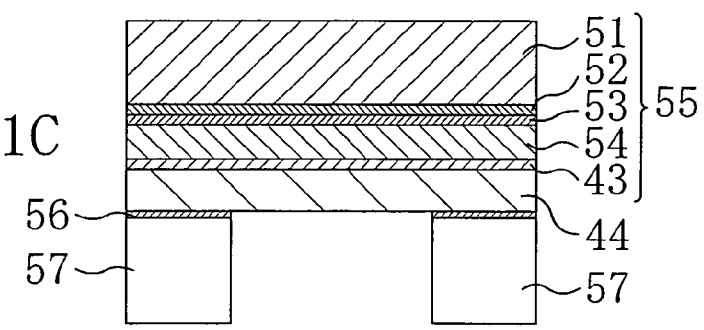

Then, as shown in FIG. 11C, a pressure chamber component 57 of glass is adhered onto the diaphragm film 44 with an adhesive (an acrylic resin) 56.

Figure 11D:
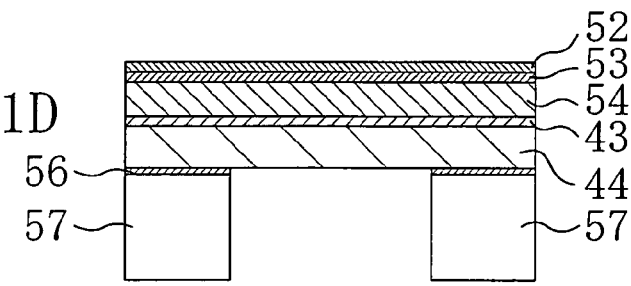

Next, as shown in FIG. 11D, the silicon substrate 51 is removed by dry etching using $SF_6$ gas with a plasma reactive etching apparatus.

Figure 11E:
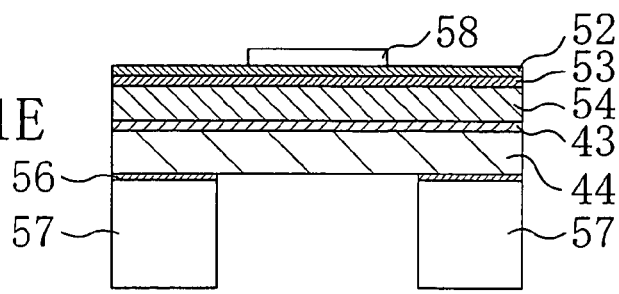

Thereafter, as shown in FIG. 11E, a photoresist 58 is formed on the first electrode film 52 and then the photoresist 58 is patterned so as to correspond to the position of the pressure chamber 32.

Figure 12A:
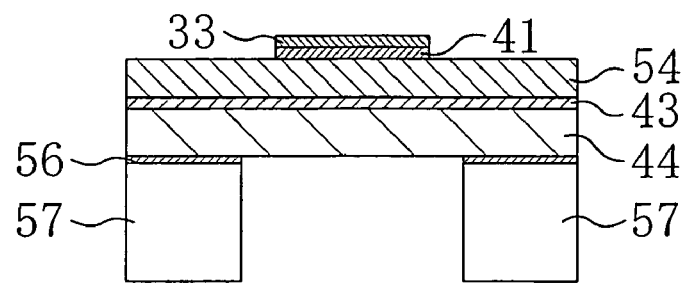
FIGS. 12A, 12B, 12C and 12D are cross-sectional views illustrating part of respective steps for fabricating an actuator component.

Next, as shown in FIG. 12A, each of the first electrode film 52 and the first piezoelectric thin film 53 is patterned by dry etching so as to correspond to the position of the pressure chamber 32 and have the same shape, and then the photoresist 58 is removed. Note that in the step of patterning the first electrode film 52 and the first piezoelectric thin film 53, patterning is preferably performed by dry etching using a gas containing a halogen element or a mixture of a gas containing a halogen element and an inert gas.

Figure 12B:
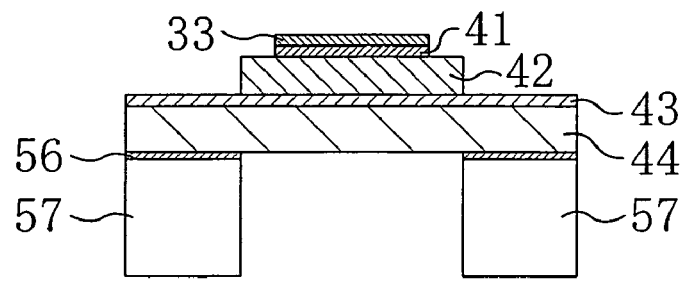

Then, using the same photoresist, the second piezoelectric thin film 54 is patterned by wet etching so as to have a larger size than that of the individual electrode 33. Thus, as shown in FIG. 12B, a layered film including the first electrode film 52, the first piezoelectric thin film 53, and the second piezoelectric thin film 54 is individualized, so that an actuator structure can be obtained. Note that in the step of patterning the second piezoelectric thin film 54, patterning is preferably performed by wet etching using an etchant containing a mixture of hydrofluoric acid and nitric acid as a main component.

Figure 12C:
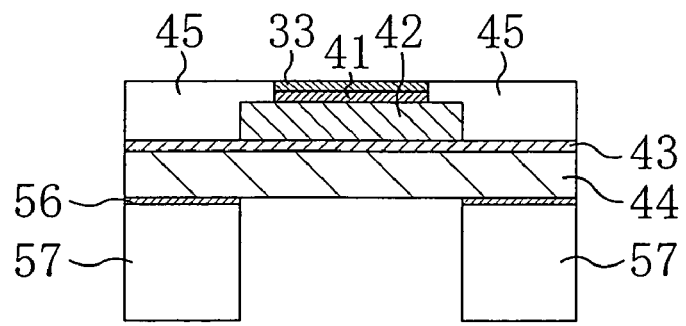
Figure 12D:
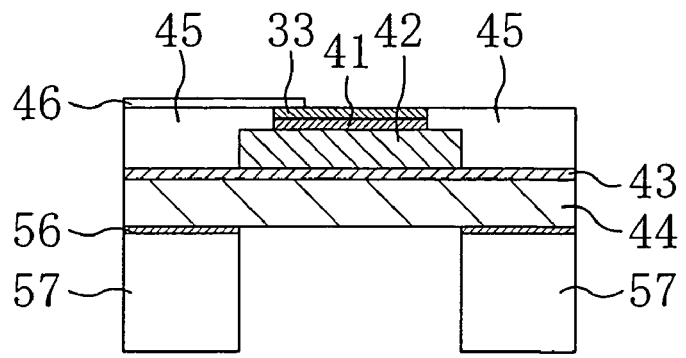

Next, as shown in FIG. 12C, an electric insulating organic film 45 is formed on part of the second electrode film 43 other than the layered film by a print process. Thereafter, as shown in FIG. 12D, a lead 46 is formed on a top face of the electric insulating organic film 45 by DC sputtering. Thus, the actuator component B of FIG. 9 can be obtained.

By the above-described formation method, thirty ink discharging devices 202 having the same shape and the same size were formed. Then, a sign wave voltage (200 Hz) of 0 V to −50 V was applied to between the individual electrode 33 of each of the ink discharging devices 202 and the second electrode film 43, thereby driving each of the ink discharging devices 202 in a high-temperature, high-humidity atmosphere (at a temperature of 50° C. and a humidity of 50%). As a result, all of the ink discharging devices 202 could be driven for a long time without breaking down.

Using ten ink discharging devices 202 formed in the above described method, the inkjet head 201 of FIG. 8 was fabricated.

Operation of Inkjet Head

Hereinafter, the operation of the inkjet head 201 will be described. In the inkjet head 201 of FIG. 8, a voltage is supplied from a driving power supply device 203 through a bonding wire to each of the respective individual electrodes 33 of the ten ink discharging devices 202. Thus, the diaphragm film 44 is displaced to vibrate owing to the piezoelectric effect of the piezoelectric thin films 41 and 42. Accordingly, an ink contained in the common ink chamber 35 is discharged from the nozzle hole 38 via the supply port 36, the pressure chamber 32 and the ink passage 37. At this point, in the inkjet head 201, each of the piezoelectric thin films 41 and 42 has a crystal orientation along the (001) plane. Also, each of the piezoelectric thin films 41 and 42 has high piezoelectric displacement properties. Therefore, large piezoelectric displacement (displacement amount) can be attained by the inkjet head 201.

Moreover, piezoelectric displacement of the ink discharging device 202 is large, namely, the ink discharging ability of the ink discharging device 202 is high, and thus a large margin can be provided in adjustment of the power voltage. Therefore, the ink discharging ability of each of the ink discharging devices 202 can be easily controlled. Accordingly, a variation in the ink discharging ability among the ink discharging devices 202 can be reduced.

EXAMPLE 10

Figure 13:
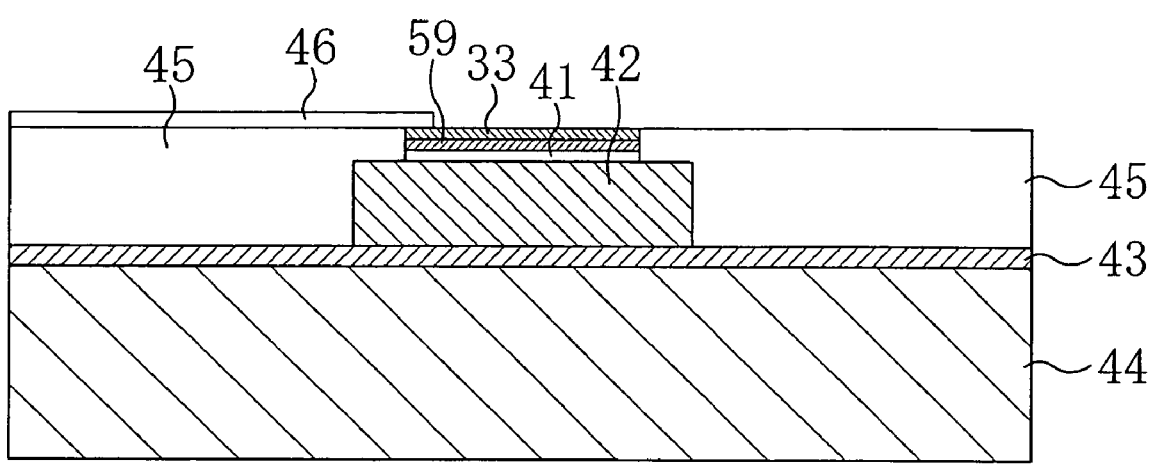
FIG. 13 is a cross-sectional view of a modified example of the ink discharging device, corresponding to FIG. 10.

As shown in FIG. 13, an inkjet head of this example is different from that of Example 9 in that an orientation controlling film 59 is provided between the individual electrode 33 and the first piezoelectric thin film 41 but, apart from that, the inkjet head of this example has substantially the same structure as that of Example 9. The orientation controlling film 59 is made of lead lanthanum titanate as in Example 6.

A method for forming the ink discharging device 202 according to this example is different from that of Example 9 in that the orientation control film 59 is formed between the first electrode film 52 and the first piezoelectric thin film 53 and also the orientation control film 59 as well as the first electrode film 52 and the first piezoelectric thin film 53 is patterned by dry etching so that these films correspond to the position of the pressure chamber 32. Apart from this point, the method of this example is substantially the same as that of Example 9. The orientation controlling film 59 is formed by the same method as that for forming the orientation controlling film of Example 6.

Using the ink discharging device 202 formed in the above described method, an inkjet head 201 was fabricated.

Effects

As has been described, according to this embodiment, in the inkjet head 201 in which the plurality of ink discharging devices 202 are arranged so as to be brought into line with one another, a variation in the ink discharging ability among the ink discharging devices 202 can be reduced. Therefore, the inkjet head 201 with high reliability can be achieved.

Note that the actuator component B with excellent properties can be formed by using any materials for forming the first electrode film 52, the orientation controlling film 59, the first piezoelectric thin film 53, the second piezoelectric thin film 54 and the second electrode film 43 of the actuator component B as far as they are materials used in the piezoelectric elements of EMBODIMENTS 1 and 2.

Moreover, in this embodiment, the diaphragm film 44 is made of chromium. However, the diaphragm film 44 may be made of silicon, glass, a ceramic material or a metal material other than chromium.

Furthermore, in this embodiment, the diaphragm film 44 is formed on the face of the second electrode film 43 opposing to the second piezoelectric thin film 42. However, the diaphragm film 44 may be formed on the face of the individual electrode 33 opposing to the first piezoelectric thin film 41 (orientation controlling film 59).

(Embodiment 4)

Figure 14:
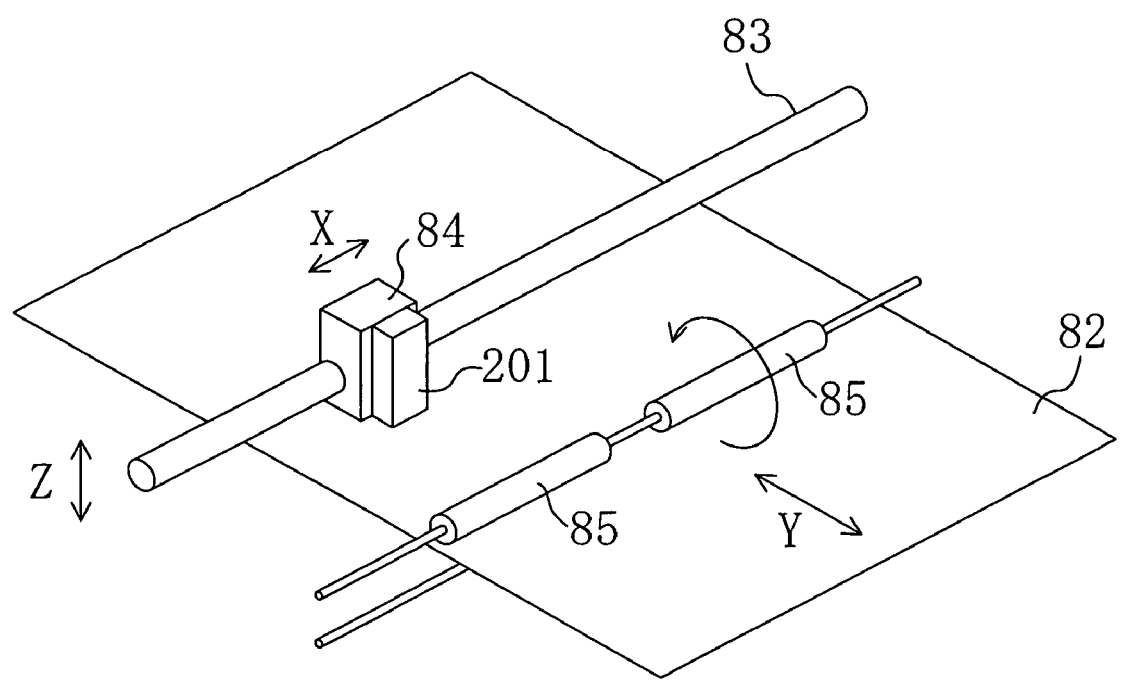
FIG. 14 is a perspective view schematically illustrating an inkjet recording apparatus.

In this embodiment, a piezoelectric element according to the present invention is applied to an inkjet recording apparatus. As shown in FIG. 14, an inkjet recording apparatus 81 according to this example includes the inkjet head 201 of Embodiment 3 for performing a recording operation by using the piezoelectric effect of the piezoelectric thin films 41 and 42. Thus, data can be recorded on a recording medium 82 such as paper by adhering ink drops discharged from the inkjet head 201 onto the recording medium 82. The inkjet head 201 is loaded on a carriage 84 provided on a carriage axis 83 disposed along a primary scanning direction (that is, the X-direction in FIG. 14). The carriage 84 is reciprocated along the carriage axis 83, so that the inkjet head 201 can be reciprocated along the primary scanning direction X. The inkjet recording apparatus 81 further includes a plurality of rollers 85 for moving the recording medium 82 along a secondary scanning direction Y substantially perpendicular to the primary scanning direction X. Note that moving means according to the present invention corresponds to a combination of the carriage axis 83, the carriage 84 and the rollers 85.

Effect

As has been described, in this example, the line inkjet recording apparatus 81 includes the inkjet head 201 with a small variation in the ink discharging ability among the ink discharging devices 202. Therefore, an inkjet recording apparatus 81 which allows reduction in unevenness in printing in the recording operation and has high reliability can be achieved.

Note that in this embodiment, the inkjet head 201 is applied to a so-called serial inkjet recording apparatus 81. However, the inkjet head 201 may be applied to a so-called line inkjet recording apparatus.

As has been described, the present invention is useful for not only an inkjet head but also a gyrostabilizer and the like. Also, the present invention is applicable to a micro machine device or the like.

What is claimed is:

1. A piezoelectric element comprising:
a first electrode film;
a piezoelectric layered film including a first piezoelectric film formed on the first electrode film and a second piezoelectric film formed on the first piezoelectric film and controlled in crystal orientation thereof by the first piezoelectric film; and
a second electrode film formed on the second piezoelectric film,
wherein each of the first and second piezoelectric films is an aggregate of columnar grains grown unidirectionally along the thickness direction of the piezoelectric layered film,
wherein the first piezoelectric film has a smaller Pb content than a Pb content of the second piezoelectric film,
wherein a columnar grain of the second piezoelectric film has a larger average cross-sectional diameter than an average cross-sectional diameter of a columnar grain of the first piezoelectric film, and
wherein a ratio of a thickness of the piezoelectric layered film to the average cross-sectional diameter of the columnar grain of the second piezoelectric film is not less than 20 and not more than 60.

2. A piezoelectric element comprising:
a first electrode film;
an orientation controlling film formed on the first electrode film;
a piezoelectric layered film including a first piezoelectric film formed on the orientation controlling film and a second piezoelectric film formed on the first piezoelectric film and controlled in crystal orientation thereof by the first piezoelectric film; and
a second electrode film formed on the second piezoelectric film,
wherein each of the first and second piezoelectric films is an aggregate of columnar grains grown unidirectionally along the thickness direction of the piezoelectric layered film,
wherein the first piezoelectric film has a smaller Pb content than a Pb content of the second piezoelectric film,
wherein a columnar grain of the second piezoelectric film has a larger average cross-sectional diameter than an average cross-sectional diameter of a columnar grain of the first piezoelectric film, and
wherein a ratio of a thickness of the piezoelectric layered film to the average cross-sectional diameter of the columnar grain of the second piezoelectric film is not less than 20 and not more than 60.

3. The piezoelectric element of claim 1,
wherein the columnar grain of the first piezoelectric film has an average cross-sectional diameter of not less than 40 nm and not more than 70 nm and a length of not less than 5 nm and not more than 100 nm.

4. The piezoelectric element of claim 2,
wherein the columnar grain of the first piezoelectric film has an average cross-sectional diameter of not less than 40 nm and not more than 70 nm and a length of not less than 5 nm and not more than 100 nm.

5. The piezoelectric element of claim 1,
wherein the columnar grain of the second piezoelectric film has an average cross-sectional diameter of not less than 60 nm and not more than 200 nm and a length of not less than 2500 nm and not more than 5000 nm.

6. The piezoelectric element of claim 2,
wherein the columnar grain of the second piezoelectric film has an average cross-sectional diameter of not less than 60 nm and not more than 200 nm and a length of not less than 2500 nm and not more than 5000 nm.

7. The piezoelectric element of claim 1,
wherein each of the first and second piezoelectric films includes at least Pb, Zr and Ti in a chemical composition ratio of Pb:Zr:Ti of (1+a):b:(1−b),
wherein the b of each of the first and second piezoelectric films takes the same value, i.e., a value of not less than 0.50 and not more than 0.60,
wherein the a of the first piezoelectric film takes a value of not less than −0.05 and not more than 0.05, and
wherein the a of the second piezoelectric film takes a value of not less than 0 and not more than 0.1.

8. The piezoelectric element of claim 2,
wherein each of the first and second piezoelectric films includes at least Pb, Zr and Ti in a chemical composition ratio of Pb:Zr:Ti of (1+a):b:(1−b),
wherein the b of each of the first and second piezoelectric films takes the same value, i.e., a value of not less than 0.50 and not more than 0.60,
wherein the a of the first piezoelectric film takes a value of not less than −0.05 and not more than 0.05, and
wherein the a of the second piezoelectric film takes a value of not less than 0 and not more than 0.1.

9. The piezoelectric element of claim 1, wherein each of the first and second piezoelectric films is preferentially oriented along the (001) plane.

10. The piezoelectric element of claim 1, wherein the first electrode film is made of a noble metal selected from the group consisting of Pt, Ir, Pd and Ru, an alloy of the noble metal and at least a metal selected from the group of Ti, Co, Ni, Al, Fe, Mn, Cu, Mg, Ca, Sr and Ba or an oxide of the metal and is an aggregate of columnar grains each having an average cross-sectional diameter of not less than 20 nm and not more than 30 nm.

11. The piezoelectric element of claim 2, wherein the first electrode film is made of a noble metal selected from the group consisting of Pt, Ir, Pd and Ru, an alloy of the noble metal and at least a metal selected from the group of Ti, Co, Ni, Al, Fe, Mn, Cu, Mg, Ca, Sr and Ba or an oxide of the metal, and is an aggregate of columnar grains each having an average cross-sectional diameter of not less than 20 nm and not more than 30 nm.

12. The piezoelectric element of claim 2, wherein the orientation controlling film is made of lead lanthanum titanate.

13. An inkjet head comprising:
a head body including a nozzle and a pressure chamber, communicated with the nozzle, for containing an ink;
a diaphragm film provided so that part of one face of the diaphragm film corresponding to one end thereof along the thickness direction of the diaphragm film faces the pressure chamber; and
a piezoelectric element, formed on the other face of the diaphragm film corresponding to the other end thereof along the thickness direction of the diaphragm film, for applying a pressure to the ink contained in the pressure chamber to discharge the ink from the nozzle,
wherein the piezoelectric element includes a first electrode film, a piezoelectric layered film including a first piezoelectric film formed on the first electrode film and a second piezoelectric film formed on the first piezoelectric film and controlled in crystal orientation thereof by the first piezoelectric film, and a second electrode film formed on the second piezoelectric film,
wherein each of the first and second piezoelectric films is an aggregate of columnar grains grown unidirectionally along the thickness direction of the piezoelectric layered film,
wherein the first piezoelectric film has a smaller Pb content than a Pb content of the second piezoelectric film,
wherein a columnar grain of the second piezoelectric film has a larger average cross-sectional diameter than an average cross-section of a columnar grain of the first piezoelectric film, and
wherein a ratio of a thickness of the piezoelectric layered film to the average cross-sectional diameter of the columnar grain of the second piezoelectric film is not less than 20 and not more than 60.

14. An inkjet head comprising:
a head body including a nozzle and a pressure chamber, communicated with the nozzle, for containing an ink;
a diaphragm film provided so that part of one face of the diaphragm film corresponding to one end thereof along the thickness direction of the diaphragm film faces the pressure chamber; and
a piezoelectric element, formed on the other face of the diaphragm film corresponding to the other end thereof along the thickness direction of the diaphragm film, for applying a pressure to the ink contained in the pressure chamber to discharge the ink from the nozzle,
wherein the piezoelectric element includes a first electrode film, a piezoelectric layered film including an orientation controlling film formed on the first electrode film, a first piezoelectric film formed on the orientation controlling film and a second piezoelectric film formed on the first piezoelectric film and controlled in crystal orientation thereof by the first piezoelectric film, and a second electrode film formed on the second piezoelectric film,
wherein each of the first and second piezoelectric films is an aggregate of columnar grains grown unidirectionally along the thickness direction of the piezoelectric layered film,
wherein the first piezoelectric film has a smaller Pb content than a Pb content of the second piezoelectric film,
wherein a columnar grain of the second piezoelectric film has a larger average cross-sectional diameter than an average cross-section of a columnar grain of the first piezoelectric film, and
wherein a ratio of a thickness of the piezoelectric layered film to the average cross-sectional diameter of the columnar grain of the second piezoelectric film is not less than 20 and not more than 60.

15. An inkjet recording apparatus comprising:
an inkjet head; and
moving means for making the inkjet head and a recording medium move relative to each other,
wherein the inkjet head includes a head body including a nozzle and a pressure chamber, communicated with the nozzle, for containing an ink, a diaphragm film provided so that part of one face of the diaphragm film corresponding to one end thereof along the thickness direction of the diaphragm film faces the pressure chamber, and a piezoelectric element, formed on the other face of the diaphragm film corresponding to the other end thereof along the thickness direction of the diaphragm film, for applying a pressure to the ink contained in the pressure chamber to discharge the ink from the nozzle, wherein the piezoelectric element includes a first electrode film, a piezoelectric layered film including a first piezoelectric film formed on the first electrode film and a second piezoelectric film formed on the first piezoelectric film and controlled in crystal orientation thereof by the first piezoelectric film, and a second electrode film formed on the second piezoelectric film, wherein each of the first and second piezoelectric films is an aggregate of columnar grains grown unidirectionally along the thickness direction of the piezoelectric layered film, wherein the first piezoelectric film has a smaller Pb content than a Pb content of the second piezoelectric film, wherein a columnar grain of the second piezoelectric film has a larger average cross-sectional diameter than an average cross-sectional diameter of a columnar grain of the first piezoelectric film, and wherein a ratio of a thickness of the piezoelectric layered film to the average cross-sectional diameter of the columnar grain of the second piezoelectric film is not less than 20 and not more than 60.

16. An inkjet recording apparatus comprising:
an inkjet head; and
moving means for making the inkjet head and a recording medium move relative to each other,
wherein the inkjet head includes a head body including a nozzle and a pressure chamber, communicated with the nozzle, for containing an ink, a diaphragm film provided so that part of one face of the diaphragm film corresponding one end thereof along the thickness direction of the diaphragm film faces the pressure chamber, and a piezoelectric element, formed on the other face of the diaphragm film corresponding to the other end thereof along the thickness direction of the diaphragm film, for applying a pressure to the ink contained in the pressure chamber to discharge the ink from the nozzle, wherein the piezoelectric element includes a first electrode film, a piezoelectric layered film including an orientation controlling film formed on the first electrode film, a first piezoelectric film formed on the orientation controlling film and a second piezoelectric film formed on the first piezoelectric film and controlled in crystal orientation thereof by the first piezoelectric film, and a second electrode film formed on the second piezoelectric film, wherein each of the first and second piezoelectric films is an aggregate of columnar grains grown unidirectionally along the thickness direction of the piezoelectric layered film, wherein the first piezoelectric film has a smaller Pb content than a Pb content of the second piezoelectric film, wherein a columnar grain of the second piezoelectric film has a larger average cross-sectional diameter than an average cross-section of a columnar grain of the first piezoelectric film, and wherein a ratio of a thickness of the piezoelectric layered film to the average cross-sectional diameter of the columnar grain of the second piezoelectric film is not less than 20 and not more than 60.

* * * * *